US011901398B2

(12) United States Patent
Chu et al.

(10) Patent No.: US 11,901,398 B2
(45) Date of Patent: Feb. 13, 2024

(54) DISPLAY APPARATUS HAVING A SUBSTRATE HOLE

(71) Applicant: LG Display Co., Ltd., Seoul (KR)

(72) Inventors: Dong-Il Chu, Gimpo-si (KR); Min-Joo Kim, Seoul (KR); Jae-Won Lee, Goyang-si (KR); Sang-Hoon Pak, Seoul (KR); Sang-Hyuk Won, Gimpo-si (KR); Seung-Hyun Youk, Paju-si (KR); Seon-Hee Lee, Incheon (KR)

(73) Assignee: LG DISPLAY CO., LTD., Seoul (KR)

( * ) Notice: Subject to any disclaimer, the term of this patent is extended or adjusted under 35 U.S.C. 154(b) by 303 days.

(21) Appl. No.: 17/136,967

(22) Filed: Dec. 29, 2020

(65) Prior Publication Data
US 2021/0202570 A1   Jul. 1, 2021

(30) Foreign Application Priority Data
Dec. 31, 2019   (KR) .......................... 10-2019-0180056

(51) Int. Cl.
*H01L 27/15*   (2006.01)
*H01L 29/786*  (2006.01)
(Continued)

(52) U.S. Cl.
CPC ........ *H01L 27/156* (2013.01); *H01L 29/7869* (2013.01); *H01L 29/78618* (2013.01);
(Continued)

(58) Field of Classification Search
CPC .. H10K 59/13; H10K 59/124; H10K 50/8445; H10K 59/122; H10K 59/65;
(Continued)

(56) References Cited

U.S. PATENT DOCUMENTS

2017/0148856 A1   5/2017   Choi et al.
2017/0149014 A1   5/2017   Choi et al.
(Continued)

FOREIGN PATENT DOCUMENTS

CN   106887523 A   6/2017
CN   107240596 A   10/2017

*Primary Examiner* — Latanya N Crawford Eason
(74) *Attorney, Agent, or Firm* — Birch, Stewart, Kolasch & Birch, LLP

(57) ABSTRACT

A display apparatus includes a substrate including a penetrating area including a substrate hole, and a separating area surrounding the penetrating area, a first buffer layer including a first-buffer lower layer on the substrate, and a first-buffer upper layer on the first-buffer lower layer, a first TFT including a first semiconductor pattern on the first-buffer upper layer, and a first gate electrode overlapping with the first semiconductor pattern under conditions that a first gate insulating film is interposed therebetween, and first source/drain electrodes connected to the first semiconductor pattern, a second TFT, a separation structure disposed in the separating area of the substrate while including a first separation layer having the same stacked structure as the first-buffer upper layer, a second separation layer having the same stacked structure as the first gate insulating film, and a third separation layer having the same stacked structure as the first gate electrode.

13 Claims, 7 Drawing Sheets

(51) Int. Cl.
 *H01L 33/38* (2010.01)
 *H01L 33/62* (2010.01)
 *H01L 33/12* (2010.01)

(52) U.S. Cl.
 CPC .............. *H01L 33/12* (2013.01); *H01L 33/38* (2013.01); *H01L 33/62* (2013.01)

(58) Field of Classification Search
 CPC .... H10K 59/60; H10K 59/8731; H10K 59/40; H10K 50/8426; H01L 29/7869; H01L 29/78672; H01L 29/78675; H01L 25/167; H01L 33/62; H01L 27/156; H01L 29/78618; H01L 33/12; H01L 33/38
 See application file for complete search history.

(56) References Cited

U.S. PATENT DOCUMENTS

| | | | | |
|---|---|---|---|---|
| 2018/0183015 A1* | 6/2018 | Yun | ................. | H10K 59/122 |
| 2019/0214447 A1* | 7/2019 | Kim | ................. | H10K 59/1213 |
| 2020/0258960 A1* | 8/2020 | Choi | ................. | H10K 50/8445 |

* cited by examiner

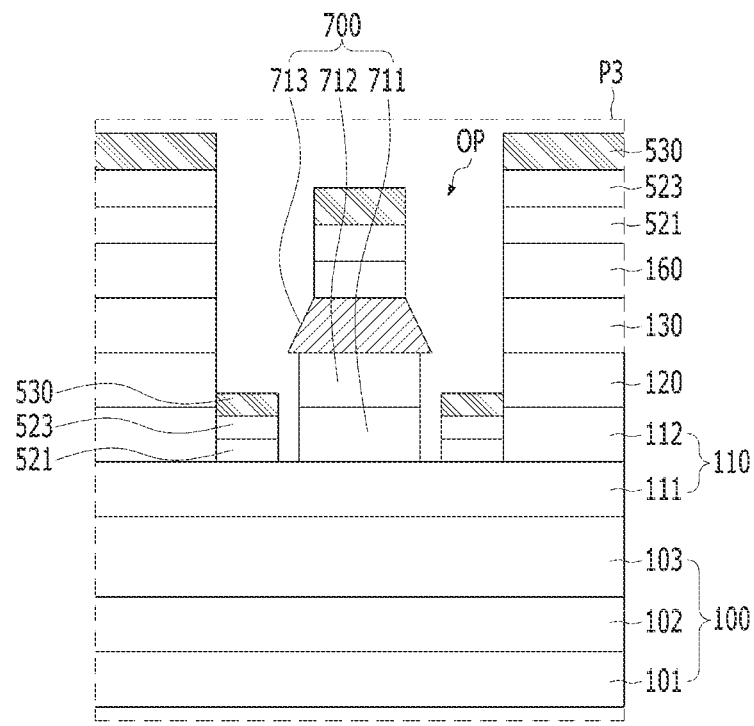
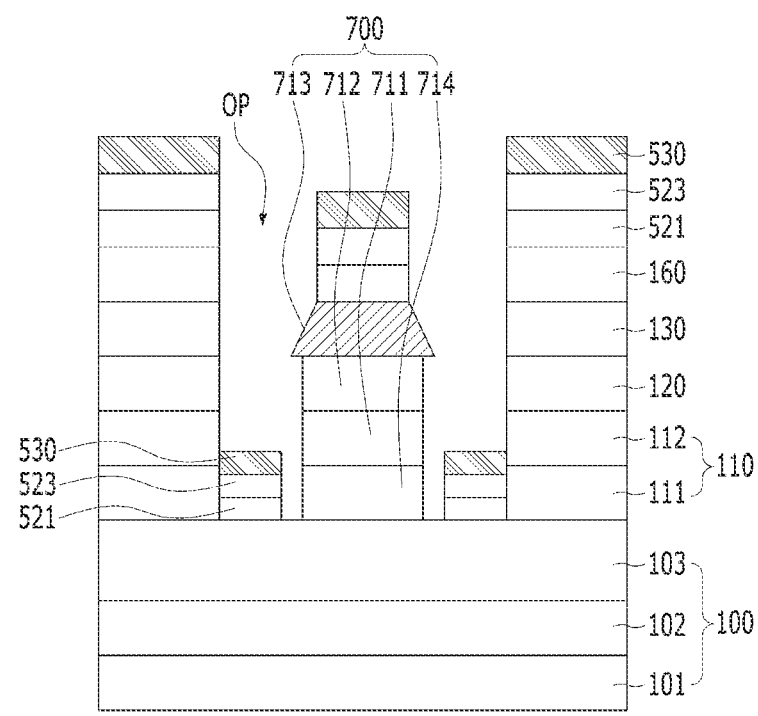

DISPLAY APPARATUS HAVING A SUBSTRATE HOLE

CROSS-REFERENCE TO RELATED APPLICATIONS

This application claims the priority benefit to Korean Patent Application No. 10-2019-0180056 filed on Dec. 31, 2019 in the Republic of Korea, the entire contents of which are hereby expressly incorporated by reference as if fully set forth herein into the present application.

BACKGROUND OF THE INVENTION

Field of the Invention

The present disclosure relates to a display apparatus including a substrate hole which penetrates a substrate.

Discussion of the Related Art

Generally, an electric appliance such as a monitor, a television (TV), a notebook computer, or a digital camera includes a display apparatus to realize an image. For example, the display apparatus can include light emitting elements. Each of the light emitting elements can emit light displaying a specific color. For example, each of the light emitting elements can include a light emitting layer disposed between a first electrode and a second electrode.

A peripheral appliance such as a camera, a speaker or a sensor can be mounted in the display apparatus. For example, the display apparatus can include a substrate hole penetrating a substrate which supports the light emitting elements. The substrate hole can be disposed between the light emitting elements. The peripheral appliance can be inserted into the substrate hole.

However, in the display apparatus, external moisture can permeate through the substrate hole. The external moisture permeating through the substrate hole can move to the light emitting elements adjacent the substrate hole through the light emitting layer. Thus, in the display apparatus, the light emitting elements which are disposed adjacent the substrate hole can be damaged due to the external moisture permeating through the substrate hole.

SUMMARY OF THE INVENTION

Accordingly, the present disclosure is directed to a display apparatus that substantially obviates one or more problems due to limitations and disadvantages of the related art.

An object of the present disclosure is to provide a display apparatus capable of preventing damage of a light emitting element due to external moisture permeating through a substrate hole.

Another object of the present disclosure is to provide a display apparatus capable of simplifying a process for blocking the external moisture.

Additional advantages, objects, and features of the disclosure will be set forth in part in the description which follows and in part will become apparent to those having ordinary skill in the art upon examination of the following or can be learned from practice of the disclosure. The objectives and other advantages of the disclosure can be realized and attained by the structure particularly pointed out in the written description and claims hereof as well as the appended drawings.

To achieve these objects and other advantages and in accordance with the purpose of the disclosure, as embodied and broadly described herein, there is provided a display apparatus. The substrate comprises a substrate. The substrate includes a penetrating area and a separating area. The penetrating area includes a substrate hole. The separating area surrounds the penetrating area. A first buffer layer includes a first-buffer lower layer on the substrate, and a first-buffer upper layer disposed on the first-buffer lower layer. A first thin film transistor is disposed on the first-buffer upper layer and includes a first semiconductor pattern, a first gate electrode, a first source electrode and a first drain electrode. The first semiconductor pattern includes poly-silicon. The first gate electrode overlaps the first semiconductor pattern under a condition that a first gate insulating film is interposed between the first gate electrode and the first semiconductor pattern. The first source electrode and the first drain electrode are connected to the first semiconductor pattern. A second thin film transistor includes a second semiconductor pattern, a second gate electrode, a second source electrode and a second drain electrode. The second semiconductor pattern includes an oxide semiconductor. The second gate electrode overlaps the second semiconductor pattern under a condition that a second gate insulating film is interposed between the second gate electrode and the second semiconductor pattern. The second source electrode and the second drain electrode are connected to the second semiconductor pattern. A separation structure is disposed in the separating area of the substrate. The separation structure includes a first separation layer having the same stacked structure as the first-buffer upper layer, a second separation layer having the same stacked structure as the first gate insulating film, and a third separation layer having the same stacked structure as the first gate electrode.

In another aspect of the present disclosure, there is provided a display apparatus comprising a substrate. The substrate includes a penetrating area and a separating area. The penetrating area includes a substrate hole. The separating area surrounds the penetrating area. A first buffer layer includes a first-buffer lower layer on the substrate, and a first-buffer upper layer disposed on the first-buffer lower layer. A first thin film transistor includes a first semiconductor pattern, a first gate electrode, a first source electrode and a first drain electrode. The first semiconductor pattern is disposed on the first-buffer upper layer. The first gate electrode overlaps the first semiconductor pattern under a condition that a first gate insulating film is interposed between the first gate electrode and the first semiconductor pattern. The first source electrode and the first drain electrode are connected to the first semiconductor pattern. A first interlayer insulating film is disposed on the first gate electrode. A second interlayer insulating film is disposed on the first interlayer insulating film. An opening extends through the second interlayer insulating film, the first interlayer insulating film, the first gate insulating film and the first-buffer upper layer, to expose the first-buffer lower layer disposed in the separating area. A separation structure is disposed in the opening. The separation structure includes a first separation layer having the same stacked structure as the first-buffer upper layer, a second separation layer having the same stacked structure as the first gate insulating film, and a third separation layer having the same stacked structure as the first gate electrode. The first separation layer is in contact with the first-buffer lower layer.

In still another aspect of the present disclosure, there is provided a display apparatus comprising a substrate. The substrate includes a penetrating area and a separating area.

The penetrating area includes a substrate hole. The separating area surrounds the penetrating area. A first buffer layer is disposed on the substrate. A first thin film transistor includes a first semiconductor pattern, a first gate electrode, a first source electrode and a first drain electrode. The first semiconductor pattern is disposed on the first buffer layer. The first gate electrode overlaps the first semiconductor pattern under a condition that a first gate insulating film is interposed between the first gate electrode and the first semiconductor pattern. The first source electrode and the first drain electrode are connected to the first semiconductor pattern. A first interlayer insulating film is disposed on the first gate electrode. A second interlayer insulating film is disposed on the first interlayer insulating film. An opening extends through the second interlayer insulating film, the first interlayer insulating film, the first gate insulating film and the first-buffer upper layer, to expose the substrate disposed in the separating area. A separation structure is disposed in the opening. The separation structure includes a first separation layer contacting the substrate, a second separation layer on the first separation layer, and a third separation layer on the second separation layer.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and along with the description serve to, explain the principle of the disclosure. In the drawings:

FIG. 7B is an enlarged view of an area P3 in FIG. 7A; and

FIG. 8 it as view illustrating a cross-section of a separation structure in a display apparatus according to another exemplary embodiment of the present disclosure.

DETAILED DESCRIPTION OF THE EMBODIMENTS

Figure 1:
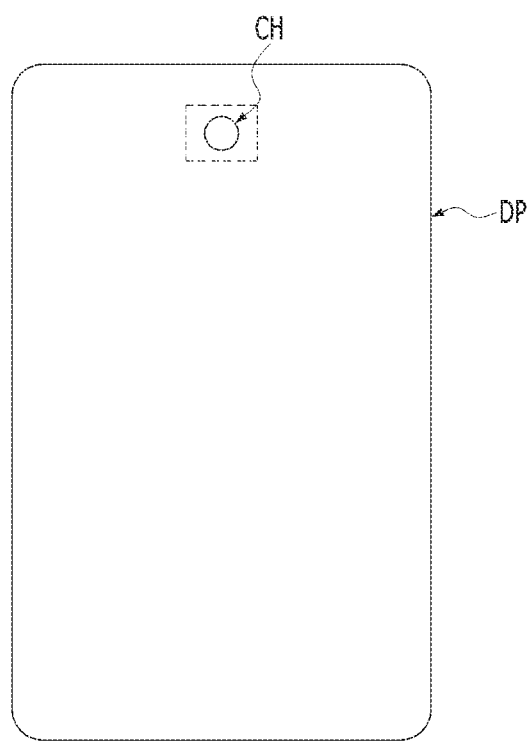
FIG. 1 is a view schematically illustrating a display apparatus according to an exemplary embodiment of the present disclosure.

Details of objects and technical configurations of the present disclosure, and functions and effects thereof will be clarified through the following detailed description given with reference to the accompanying drawings illustrating embodiments of the present disclosure. Here, embodiments of the present disclosure are provided so that the present disclosure can be sufficiently thorough and complete to assist those skilled in the art fully understanding the scope of the present disclosure. Therefore, the present disclosure can be embodied in different forms and should not be construed as limited to the embodiments set forth herein.

Throughout the specification, elements designated by the same reference numerals represent the same constituent elements. In the drawings, the length and thickness of each layer or region can be exaggerated for convenience. It will be understood that the case in which a first constituent element is referred to as being "on" a second constituent element includes not only the case in which the first constituent element is disposed on the second constituent element such that the first constituent element directly contacts the second constituent element but also the case in which a third constituent element is interposed between the first constituent element and the second constituent element.

It will be understood that although the terms "first", "second", or the like are used herein to describe various constituent elements, these terms are only used to distinguish one constituent element from another constituent element and may not define any order. Of course, the first constituent element and the second constituent element can be optionally named in accordance with convenience of those skilled in the art.

The terminology used in the specification of the present disclosure is for the purpose of describing particular embodiments only and is not intended to limit the present disclosure. For example, a constituent element expressed in the singular form is intended to include a plurality of constituent elements, unless the context clearly indicates otherwise. It will be further understood that the terms "comprising" or "having" when used in the specification of the present disclosure, specify the presence of stated features, integers, steps, operations, elements, components or combinations thereof, but do not preclude the presence or addition of one or more other features, integers, steps, operations, elements, components, or combinations thereof.

Unless otherwise defined, all terms including technical and scientific terms used herein have the same meaning as commonly understood by one of ordinary in the art to which example embodiments belong. It will be further understood that terms, such as those defined in commonly used dictionaries, should be interpreted as baying a that is consistent with their meaning in the context of the relevant art and should not be interpreted in an idealized or overly formal sense unless expressly so defined herein.

Figure 2:
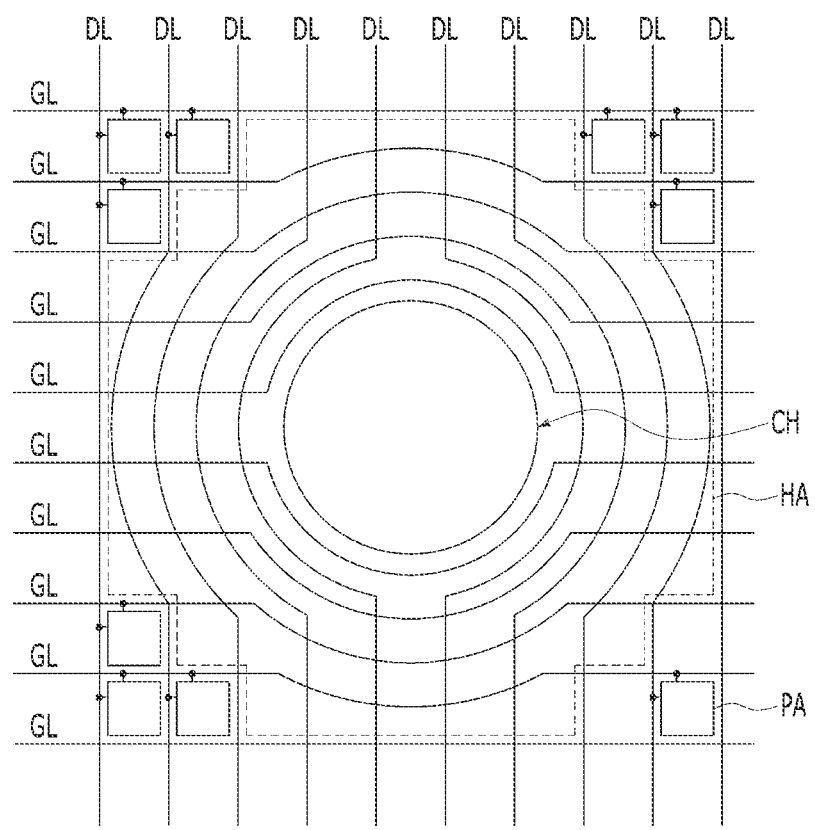
FIG. 2 is an enlarged view of an area around a substrate hole in the display apparatus according to the exemplary embodiment of the present disclosure.
Figure 3:
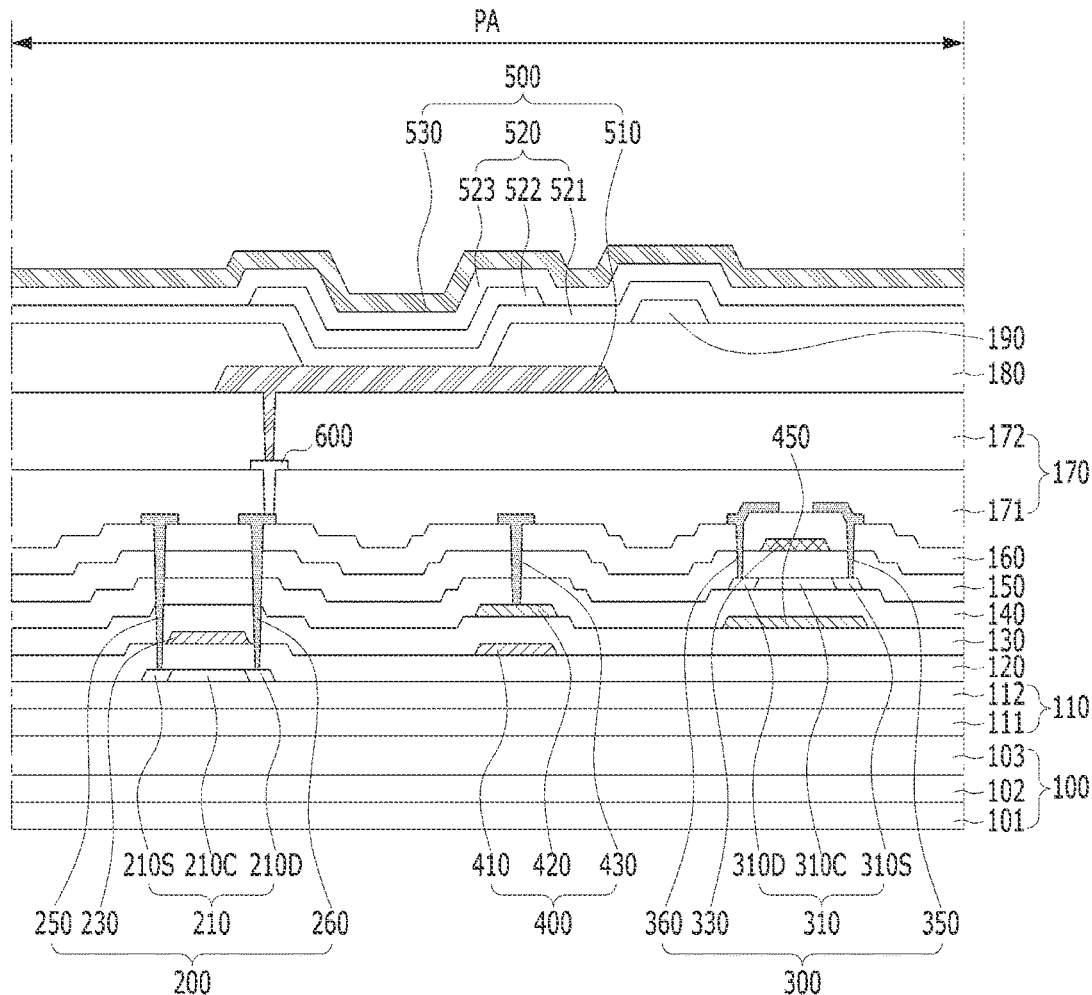
FIG. 3 is a view illustrating a cross-section of a pixel in the display apparatus according to the exemplary embodiment of the present disclosure.
Figure 4A:
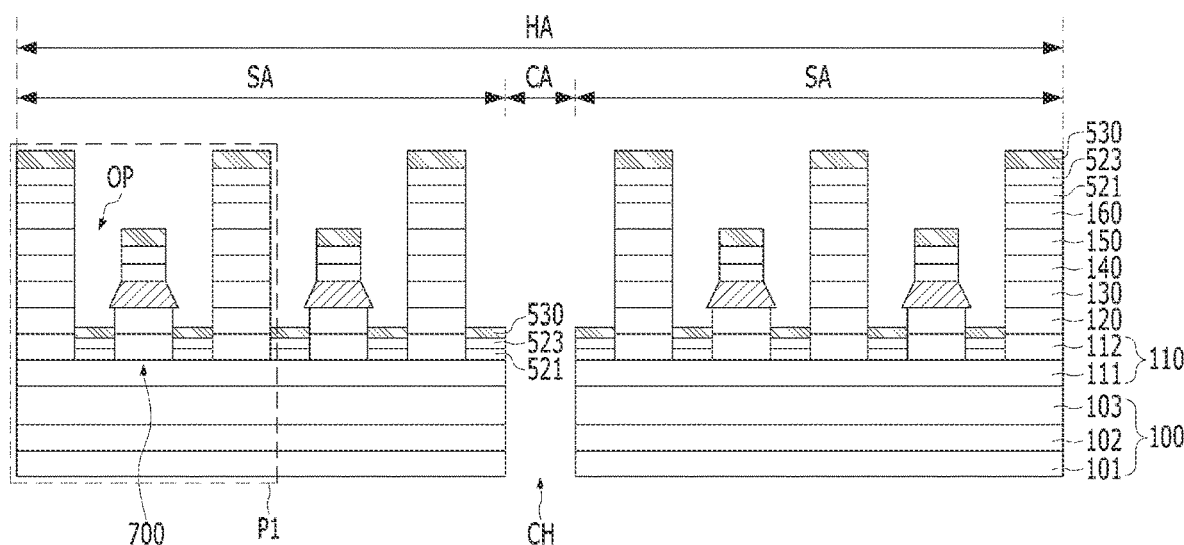
FIG. 4A is a view illustrating a cross-section of the substrate hole in the display apparatus according to the exemplary embodiment of the present disclosure.
Figure 4B:
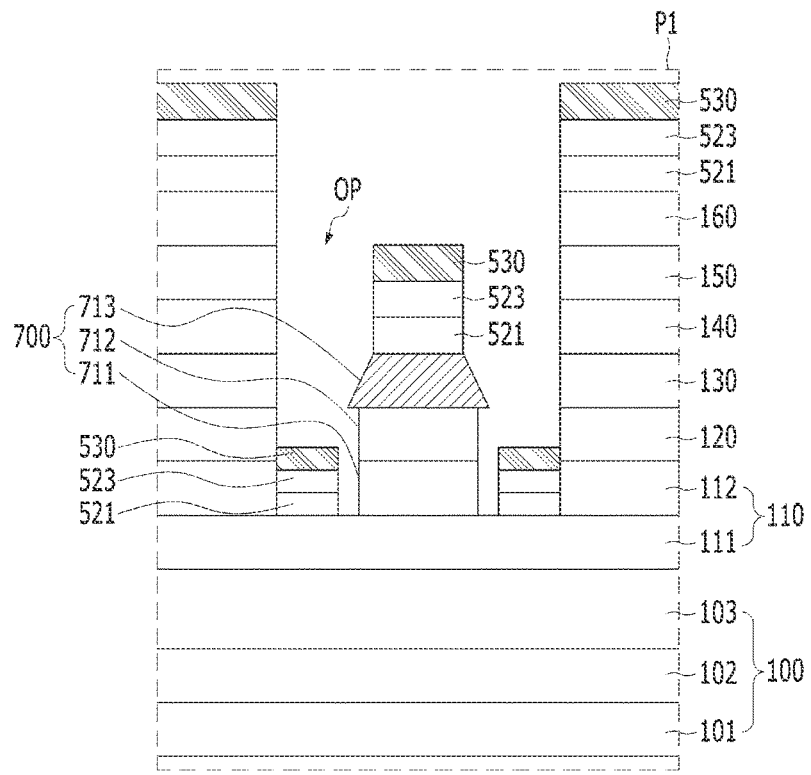
FIG. 4B is an enlarged view of an area P1 in FIG. 4A.

FIG. 1 is a view schematically illustrating a display apparatus according to an exemplary embodiment of the present disclosure. FIG. 2 is an enlarged view of an area around a substrate hole in the display apparatus according to the exemplary embodiment of the present disclosure. FIG. 3 is a view illustrating a cross-section a pixel in the display apparatus according to the exemplary embodiment of the present disclosure. FIG. 4A is a view illustrating a cross-section of the area around the substrate hole in the display apparatus according to the exemplary embodiment of the present disclosure. FIG. 4B is an enlarged view of an area P1 in FIG. 4A. All components of the display apparatus according to all embodiments of the present disclosure are operatively coupled and configured.

Referring to FIGS. 1 to 4B, a display apparatus DP according to the exemplary embodiment of the present disclosure can include a substrate 100. The substrate 100 can include a display area in which pixels PA are disposed, and a non-display area disposed adjacent to the display area. The substrate 100 can include an insulating material. For example, the substrate 100 can include glass or plastic. The substrate 100 can have a multilayer structure. For example, the substrate 100 has a structure in which an inorganic insulating layer 102 is disposed between a first substrate layer 101 and a second substrate layer 103. The second substrate layer 103 can include the same material as the first substrate layer 101. For example, the first substrate layer 101 and the second substrate layer 103 can include plastic. The inorganic insulating layer 102 can include an insulating material. For example, the first substrate layer 101 and the second substrate layer 103 can be made of polyimide (PI), and the inorganic insulating layer 102 can include a layer made of silicon nitride ($SiN_x$) or silicon oxide ($SiO_x$). The inorganic insulating layer 102 can have a multilayer structure in which a layer made of silicon nitride ($SiN_x$) and a layer made of silicon oxide ($SiO_x$) are stacked. For example, the inorganic insulating layer 102 can include a layer made of silica or silicon dioxide ($SiO_2$).

In the display apparatus, the inorganic insulating layer 102 is formed between the first substrate layer 101 and the second substrate layer 103, which are made of polyimide (PI), such that electric charges which are charged in the first substrate layer 101 disposed at a lower side can be blocked. Further, the external moisture permeating through the first substrate layer 101 and the second substrate layer 103 which are made of polyimide (PI), can be blocked by the inorganic insulating layer 102 disposed between the first substrate layer 101 and the second substrate layer 103. Thus, the reliability of the display apparatus DP according to the exemplary embodiment of the present disclosure can be improved.

The substrate 100 can include the pixels PA defined by gate lines GL and data lines DI A light emitting element 500 can be disposed in each pixel PA. Each of the light emitting elements 500 can emit light displaying a specific color. For example, each of the light emitting elements 500 can include a first electrode 510, a light emitting layer 520 and a second electrode 530, which are sequentially stacked.

The first electrode 510 can include a conductive material. The first electrode 510 can include a metal having relatively high reflectance. The first electrode 510 can have a multi-layer structure. For example, the first electrode 510 can have a structure in which a reflective electrode made of a metal such as aluminum (Al) and silver (Ag) is disposed between transparent electrodes made of a transparent conductive material such as indium tin oxide (ITO) and indium zinc oxide (IZO).

The light emitting layer 520 can generate light having luminance corresponding to a voltage difference between the first electrode 510 and the second electrode 530. For example, the light emitting layer 520 can include an emission material layer (EVIL) 522 including an emission material. The emission material can include an organic material, an inorganic material or a hybrid material. For example, the display apparatus according to the exemplary embodiment of the present disclosure can be an organic light emitting display apparatus including the light emitting layer 520 made of an organic material. Alternatively, the display apparatus according to the exemplary embodiment of the present disclosure can be an inorganic light emitting display apparatus including the light emitting layer 520 made of an inorganic material.

The light emitting layer 520 can have a multilayer structure in order to increase luminous efficacy. For example, the light emitting layer 520 can further include at least one first intermediate layer 521 disposed between the first electrode 510 and the emission material layer 522, and at least one second intermediate layer 523 disposed between the emission material layer 522 and the second electrode 530. The first intermediate layer 521 can include at least one of a hole injection layer HIL and a hole transport layer HTL. The second intermediate layer 523 can include at least one of an electron transport layer ETL and an electron injection layer EIL. However, the disclosure is not limited thereto. For example, the first intermediate layer 521 can include at least one of an electron transport layer ETL and an electron injection layer EIL, and the second intermediate layer 523 can include at least one of a hole injection layer HIL and a hole transport layer HTL.

The second electrode 530 can include a conductive material. The second electrode 530 can include a material different from the first electrode 510. For example, the second electrode 530 can be a transparent electrode made of a transparent conductive material such as ITO and IZO. Thus, in the display apparatus according to the exemplary embodiment of the present disclosure, the light generated from the light emitting layer 520 can emit outside through the second electrode 530.

A driving current corresponding to a gate signal applied by a corresponding gate line GL and a data signal applied by a corresponding data line DL can be supplied to each light emitting element 500. For example, a pixel circuit electrically connected to the corresponding light emitting element 500 can be disposed in each pixel PA. The pixel circuit can control the operation of the corresponding light emitting element 500 according to the gate signal and the data signal. For example, the pixel circuit can include a first thin film transistor 200, a second thin film transistor 300 and a storage capacitor 400.

The first thin film transistor 200 can include a first semiconductor pattern 210, a first gate electrode 230, a first source electrode 250 and a first drain electrode 260. The second thin film transistor 300 can include a second semiconductor pattern 310, a second gate electrode 330, a second source electrode 350 and a second drain electrode 360. The storage capacitor 400 can include a first storage electrode 410, a second storage electrode 420 and a third storage electrode 430.

A first buffer layer 110 can be disposed between the substrate 100 and the pixel circuit of each pixel PA. The first buffer layer 110 can prevent pollution from the substrate 100 during a process of forming the pixel circuits. For example, the first buffer layer 110 can be formed between the substrate 100 and the first semiconductor pattern 210 of each pixel PA. The first buffer layer 110 can include an insulating material. For example, the first buffer layer 110 can include a silicon oxide ($SiO_x$)-based material and/or a silicon nitride ($SiN_x$)-based material. The first buffer layer 110 can have a multilayer structure. For example, the first buffer layer 110 can include a first-buffer lower layer 111 and a first-buffer upper layer 112.

Referring to FIG. 3, the first-buffer lower layer 111 of the first buffer layer 110 can be formed on the substrate 100. The first-buffer upper layer 112 can be formed on the first-buffer lower layer 111. The first-buffer lower layer 111 can be formed by a multilayer structure which includes a layer made of a silicon nitride ($SiN_x$)-based material and a layer made of a silicon oxide ($SiO_x$)-based material. The first-buffer lower layer 111 can be formed by a multilayer structure in which a silicon oxide (SiO$_x$) layer and a silicon nitride (SiN$_x$) layer are alternately stacked. For example, the first-buffer lower layer 111 can be formed by a multilayer structure in which a silicon oxide (SiO$_x$) layer and a silicon nitride (SiN$_x$) layer are stacked, in this order.

The first-buffer upper layer 112 can be formed by a single layer made of a silicon oxide (SiO$_x$)-based material. For example, the first-buffer upper layer 112 can be formed by a single layer made of silicon dioxide (SiO$_2$).

The first semiconductor pattern 210 can be disposed on the first-buffer upper layer 112. The first semiconductor pattern 210 can include a semiconductor material. For example, the first semiconductor pattern 210 can include poly-silicon (poly-Si) which is a poly-crystalline semiconductor material. For example, the first semiconductor pattern 210 can include low-temperature poly-silicon (LTPS).

The first semiconductor pattern 210 can include a first source region 210S, a first drain region 210D and a first channel region 210C. The first channel region 210C can be disposed between the first source region 210S and the first drain region 210D. The first channel region 210C can have relatively lower conductivity than the first source region 210S and the first drain region 210D. For example, each of the first source region 210S and the first drain region 210D can have a greater conductive impurity content than the first channel region 210C.

A first gate insulating film 120 can be disposed on the first semiconductor pattern 210. The first gate insulating film 120 can extend beyond the first semiconductor pattern 210. The first gate insulating film 120 can include an insulating material. For example, the first gate insulating film 120 can include a silicon oxide (SiO$_x$)-based material. The silicon oxide (SiO$_x$)-based material can include silicon dioxide (SiO$_x$). However, the disclosure is not limited thereto, and the first gate insulating film 120 can include a silicon nitride (SiN$_x$)-based material. Alternatively, the first gate insulating film 120 can be formed by a multilayer structure including a silicon nitride (SiN)-based material layer and a silicon oxide (SiO$_x$)-based a material layer.

The first gate electrode 230 of the first thin film transistor 200 and the first storage electrode 410 of the storage capacitor 400 can be disposed on the first gate insulating film 120. For example, the first gate electrode 230 can overlap the first channel region 210C of the first semiconductor pattern 210. The first gate electrode 230 can be insulated from the first semiconductor pattern 210 by the first gate insulating film 120.

The first storage electrode 410 and the first gate electrode 230 can include a conductive material. For example, the first gate electrode 230 can include a metal such as aluminum (Al), chromium (Cr), copper (Cu), titanium (Ti), molybdenum (Mo), a tungsten (W), or an alloy thereof. Each of the first storage electrode 410 and the first gate electrode 230 can be constituted by a single layer made of metal or pan alloy material or multilayers thereof. The first storage electrode 410 and the first gate electrode 230 can be made of the same material, and can be disposed on the layer.

The first interlayer insulating film 130 can be disposed on the first storage electrode 410, the first gate insulating film 120, and the first gate electrode 230. The first interlayer insulating film 130 can extend along the first gate insulating film 120. The first interlayer insulating film 130 can include an insulating material. The first interlayer insulating film 130 can include a material different from the first gate insulating film 120. For example, the first gate insulating film 120 can include a silicon oxide (SiO$_x$)-based material, and t The first interlayer insulating film 130 can include a silicon nitride (SiN$_x$)-based material. However, the disclosure is not limited thereto, and the first interlayer insulating film 130 can be formed by a multilayer structure including a silicon nitride (SiN$_x$)-based material layer and a silicon oxide (SiO$_x$)-based material layer.

The second storage electrode 420 and a metal pattern 450 can be formed on the first interlayer insulating film 130. The second storage electrode 420 can overlap the first storage electrode 410 under the condition that the first interlayer insulating film 130 is interposed between the second storage electrode 420 and the first storage electrode 410. The metal pattern 450 and the second storage electrode 420 can include a metal such as aluminum (Al), chromium (Cr), molybdenum (Mo), tungsten (W), copper (Cu), or an alloy thereof. Each of the metal pattern 450 and the second storage electrode 420 can be constituted by a single layer made of metal or an alloy material, or multiple layers thereof. The metal pattern 450 and the second storage electrode 420 can include the same material as the first storage electrode 410.

As illustrated in FIG. 3, the metal pattern 450 and the second storage electrode 420 can be formed to be spaced apart from each other ashen viewed in a cross-sectional view. However, the disclosure is not limited thereto, and the metal pattern 450 and the second storage electrode 420 can be formed to have an integrated structure in which the metal pattern 450 and the second storage electrode 420 are connected.

A second buffer layer 140 can be formed on the first interlayer insulating film 130, the metal pattern 450 and the second storage electrode 420. The second buffer layer 140 can be formed by a multilayer structure constituted by a silicon nitride (SiN$_x$)-based material and a silicon oxide (SiO$_x$)-based material. The second buffer layer 140 can be formed by a multilayer structure in which a silicon oxide (SiO$_x$) layer and a silicon nitride (SiN$_x$) layer are alternately stacked. The uppermost layer of the second buffer layer 140 contacting the second semiconductor pattern 310 of the second thin film transistor 300 can be a silicon oxide (SiO$_x$) layer. However, the disclosure is not limited thereto, and the second buffer layer 140 can be formed by a single layer made of silicon nitride (SiN$_x$) or silicon oxide (SiO$_x$).

Referring to FIG. 3, the second semiconductor pattern 310 of the second thin film transistor 300 can be formed on the second buffer layer 140. The second semiconductor pattern 310 can overlap the metal pattern 450. The second semiconductor pattern 310 can include a material different from the first semiconductor pattern 210. The second semiconductor pattern 310 can include an oxide semiconductor. For example, the second semiconductor pattern 310 can include at least one of an IZO (InZnO)-based oxide semiconductor material, an IGO (InGaO)-based oxide semiconductor material, an ITO (InSnO)-based oxide semiconductor material, an IGZO (InGaZnO)-based oxide semiconductor material, an IGZTO (InGaZnSnO)-based oxide semiconductor material, an ITZO (InSnZrtO)-based oxide semiconductor material, an IGZO (InGaSnO)-based oxide semiconductor material, a GO (CaO)-based oxide semiconductor material, a GZTO (GaZnSnO)-based oxide semiconductor material, and a GZO (GaZnO)-based oxide semiconductor material. However, the disclosure is not limited thereto, and the second semiconductor pattern 310 can be made of another oxide semiconductor material known in the art. The second semiconductor pattern 310 can include a second source region 310S, a second drain region 310D, and a second channel region 310C. The second channel region 310C can be disposed between the second source region 310S and the second drain region 310D. Resistance of the second source region 310S and resistance of the second drain region 310D can be lower than resistance of the second channel region 310C. For example, each of the second source region 310S and the second drain region 310D can be a conductorized region. The second channel region 310C can be a region which is not conductorized. The second channel region 310C of the second semiconductor pattern 310 can overlap with the metal pattern 450.

The second gate insulating film 150 can be disposed on the second buffer layer 140 and the second semiconductor pattern 310. The second gate insulating film 150 can include an insulating material. For example, the second gate insulating film 150 can include at least one of a silicon oxide ($SiO_x$) material and a silicon nitride ($SiN_x$) material. The second gate insulating film 150 can have a single-layer structure or a multilayer structure.

The second gate electrode 330 of the second thin film transistor 300 can be disposed on the second gate insulating film 150. The second gate electrode 330 can overlap with the second channel region 310C of the second semiconductor pattern 310 under the condition that the second gate insulating film 150 is interposed between the second gate electrode 330 and the second channel region 310C. The second gate electrode 330 can include a conductive material. For example, the second gate electrode 330 can include a metal such as aluminum (Al), chromium (Cr), copper (Cu), titanium (Ti), molybdenum (Mo), tungsten (W), or an alloy thereof. The second gate electrode 330 can be formed by a single layer or multiple layers. For example, the second gate electrode 330 can be formed by multiple layers including a metal layer of molybdenum (Mo) and a metal layer of titanium (Ti). When viewed in a cross-sectional view, the width of the metal layer of titanium (Ti) can be greater than the width of the metal layer of molybdenum (Mo).

The second interlayer insulating film 160 can be disposed on the second gate insulating film 150 and the second gate electrode 330. The second interlayer insulating film 160 can include an insulating material. The second interlayer insulating film 160 can be constituted by a single layer made of a silicon oxide ($SiO_x$) material or a silicon nitride ($SiN_x$) material, or multiple layers thereof. For example, the second interlayer insulating film 160 can be formed by multiple layers including a silicon oxide ($SiO_x$) layer and a silicon nitride ($SiN_x$) layer.

A contact hole can be formed to expose the first semiconductor pattern 210 of the first thin film transistor 200 by etching the second interlayer insulating film 160, the second gate insulating film 150, the second buffer layer 140, the first interlayer insulating film 130, and the first gate insulating film 120. For example, the first source region 210S and the first drain region 210D of the first semiconductor pattern 210 can be exposed by the contact hole, respectively. A contact hole can lie formed to expose the second semiconductor pattern 310 of the second thin film transistor 300 by etching the second interlayer insulating film 160 and the second gate insulating film 150. Therefore, the second source region 310S and the second drain region 310D of the second semiconductor pattern 310 can be exposed by the contact hole, respectively.

A contact hole can be formed to expose the second storage electrode 420 of the storage capacitor 400 by etching the second interlayer insulating film 160, the second gate insulating film 150, and the second buffer layer 140. Thus, the second storage electrode 420 of lire storage capacitor 400 can be exposed by the contact hole.

The second source electrode 350 and the second drain electrode 360 of the second thin film transistor 300, the first source electrode 250 and the first drain electrode 260 of the first thin film transistor 200, and the third storage electrode 430 of the storage capacitor 400 can be disposed on the second interlayer insulating film 160.

The second source electrode 350 and the second drain electrode 360 of the second thin film transistor 300 can be connected to the second source region 310S and the second drain region 310D of the second semiconductor pattern 310 through the contact hole which is formed in the second interlayer insulating film 160, the second gate insulating film 150, the second buffer layer 140, the first interlayer insulating film 130 and the first gate insulating film 120, respectively.

The first source electrode 250 and the first drain electrode 260 of the first thin film transistor 200 can be connected to the first source region 210S and the first drain region 210D of the first semiconductor pattern 210 through the contact hole formed in the second interlayer insulating film 160 and the second gate insulating film 150, respectively.

The third storage electrode 430 of the storage capacitor 400 can be connected to the second storage electrode 420 through the contact hole formed in the second interlayer insulating film 160, the second gate insulating film 150 and the second buffer layer 140.

The second source electrode 350, the second drain electrode 360, the first source electrode 250, the first drain electrode 260, and the third storage electrode 430 can be made of the same material, and can be disposed on the same layer. The second source electrode 350, the second drain electrode 360, the first source electrode 250, the first drain electrode 260, and the third storage electrode 430 can be formed by a single layer or multiple layers made of at least one of molybdenum (Mo), copper (Cu), titanium (Ti), aluminum (Al), chromium (Cr), gold (Au), nickel (Ni), and neodymium (Nd), and an alloy thereof. For example, each of the second source electrode 350, the second drain electrode 360, the first source electrode 250, the first drain electrode 260, and the third storage electrode 430 can be formed to have a triple layers structure. For example, each of the second source electrode 350, the second drain electrode 360, the first source electrode 250, the first drain electrode 260, and the third storage electrode 430 can have a structure which an intermediate layer including a metal layer of titanium (Ti) is interposed between the lower layer and the upper layer which are a metal layer of aluminum (Al).

The third storage electrode 430 can be electrically connected to the second drain electrode 360 of the second thin film transistor 300. For example, the third storage electrode 430 can be formed to have a structure integrated with the second drain electrode 360 of the second thin film transistor 300, such that the third storage electrode 430 and the second drain electrode 360 are connected.

A first passivation layer 171 of a passivation layer 170 can be formed on the second source electrode 350, the second drain electrode 360, the first source electrode 250, the first drain electrode 260, and the third storage electrode 430.

A contact hole exposing the first drain electrode 260 of the first thin film transistor 200 can be formed in the first passivation layer 171. However, the disclosure is not limited thereto, and a contact hole exposing the first source electrode 250 of the first thin film transistor 200 can be formed in the first passivation layer 171. A contact hole exposing the second drain electrode 360 or the second source electrode 350 of the second thin film transistor 300 can be formed in the first passivation layer 171. The first passivation layer 171 can be made of an inorganic material or an organic material. For example, the first passivation layer 171 can include an inorganic material, such as a silicon oxide (SiO$_x$)-based material and a silicon nitride (SiN$_x$)-based material. For example, the first passivation layer 171 can be made of an organic material, such as acryl resin, epoxy resin, phenolic resin, polyamide resin and polyimide resin.

An auxiliary electrode 600 can be formed on the first passivation layer 171. The auxiliary electrode 600 can be connected to the first drain electrode 260 of the first thin film transistor 200 exposed by the contact hole in the first passivation layer 171. However, the disclosure is not limited thereto, and the auxiliary electrode 600 can be connected to the second drain electrode 360 or the second source electrode 350 of the second thin film transistor 300 by the contact hole in the first passivation layer 171. The auxiliary electrode 600 can be formed by a single layer or multiple layers made of at least one of molybdenum (Mo), copper (Cu), titanium (Ti), aluminum (Al), chromium (Cr), gold (Au), nickel (Ni), and neodymium (Nd), and an alloy thereof. The auxiliary electrode 600 can include the same material as the second drain electrode 360.

A second passivation layer 172 can be formed on the first passivation layer 171 and the auxiliary electrode 600. A contact hole exposing the auxiliary electrode 600 can be formed in the second passivation layer 172. The second passivation layer 172 can remove a thickness difference due to the pixel circuit of each pixel PA. For example, an upper surface of the second passivation layer 172 toward the light emitting element 500 of each pixel PA can be a flat surface. The second passivation layer 172 can include an organic insulating material. For example, the second passivation layer 172 can be made of an organic material, such as acryl resin, epoxy resin, phenolic resin, polyamide resin, and polyimide resin. The second passivation layer 172 can include a material different from the first passivation layer 171.

The light emitting element 500 of each pixel PA can be electrically connected to the first thin film transistor of the corresponding pixel PA. For example, the first electrode of each pixel PA can be connected to the auxiliary electrode 600 by penetrating the second passivation layer 172 and, the auxiliary electrode 600 can be connected to the first drain electrode 260 of the first thin film transistor 200 by penetrating the first passivation layer 171. Thus, the first electrode 510 of each pixel PA can be electrically connected to the first thin film transistor 200. The first thin film transistor 200 connected to the first electrode 510 of the light emitting element 500 can be a driving thin film transistor configured to supply driving current to the light emitting element 500. However, the disclosure is not limited thereto, and the first electrode 510 of the light emitting element 500 can be connected to the second thin film transistor 300. In this case, the second thin film transistor 300 connected to the first electrode 510 can become a driving thin film transistor configured to supply driving current to the light emitting element 500.

The first electrode 510 can be formed to have a multilayer structure which includes a transparent conductive film and an opaque conductive film having high reflection efficiency. The transparent conductive film can be made of a material having a relatively larger work function value such as indium tin oxide (ITO) and indium zinc oxide (IZO). The opaque conductive film can be formed by a single layer or multiple layers including aluminum (Al), silver (Ag), copper (Cu), lead (Pb), molybdenum (Mo), titanium (Ti) or an alloy thereof. For example, the first electrode 510 can have a structure m which a transparent conductive film, an opaque conductive film and a transparent conductive film are stacked, in this order. However, the disclosure is not limited thereto, and the first electrode 510 can have a structure in which a transparent conductive film and an opaque conductive film can be sequentially formed.

The display apparatus according to the exemplary embodiment of the present disclosure can be a top emission display apparatus in which the first electrode 510 is an anode. However, the disclosure is not limited thereto. For example, the display apparatus according to the exemplary embodiment of the present disclosure can be a bottom emission display apparatus in which the first electrode 510 on the passivation layer 170 is a cathode.

The light emitting element 500 of each pixel PA can be independently operated. For example, the first electrode 510 of each pixel PA can be insulated from the first electrode 510 of adjacent pixel PA. And edge of each first electrode 510 can be covered by a bank layer 180. The hank layer 180 can be disposed on the second passivation layer 172. The light emitting layer 520 and the second electrode 530 of each pixel PA can be stacked on the first electrode 510 exposed by the bank layer 180. The bank layer 180 can include an insulating material. For example, the bank layer 180 can include an organic insulating material. The bank layer 180 can include a material different from the second passivation layer 172. The hank layer 180 can define an emission area of the display apparatus. For example, the bank layer 180 can be referred to as a "pixel definition film". A spacer 190 can be disposed on the bank layer 180.

At least a portion of the light emitting layer 520 of each pixel PA can extend onto the bank layer 180. For example, the first intermediate layer 521 and the second intermediate layer 523 of each pixel PA can be connected to the first intermediate layer 521 and the second intermediate layer 523 of adjacent pixel PA. The emission material layer 522 of each pixel PA can be spaced apart from the light emitting material layer 522 of adjacent pixel PA. The second electrode 530 of each pixel PA can extend onto the hank layer 180. For example, the second electrode 530 of each pixel PA can be connected to the second electrode 530 of adjacent pixel PA.

An encapsulating element to prevent permeation of moisture can be disposed on the second electrode 530. The encapsulating element can include a first encapsulation layer, a second encapsulation layer and a third encapsulation layer. The second encapsulation layer can include a material different from the first encapsulation layer and the third encapsulation layer. For example, each of the first and third encapsulation layers can be an inorganic insulating film made of an inorganic insulating material, and the second encapsulation layer can be an organic insulating film made of an organic insulating material. The first encapsulation layer of the encapsulating element can be disposed on the second electrode 530. The second encapsulation layer can be disposed on the first encapsulation layer. The third encapsulation layer can be disposed on the second encapsulation layer.

The first and third encapsulation layers of the encapsulating element can be made of an inorganic material such as silicon nitride (SiN$_x$) and silicon oxide (SiO$_x$). The second encapsulation layer of the encapsulating element can be made of an organic material such as acryl resin, epoxy resin, phenolic resin, polyamide resin, and polyimide resin.

In the display apparatus according to the exemplary embodiment of the present disclosure, the first thin film transistor 200 can function as a driving transistor. Thus, the first electrode 510 of the light emitting element 500 can be connected to the first thin film transistor 200, but the disclosure is not limited thereto. For example, the first electrode 510 of the light emitting element 500 can be connected to the second thin film transistor 300, and the second thin film transistor 300 can function as a driving transistor.

Referring to FIG. 4A, a substrate hole CH can be formed in the display area of the substrate 100. The substrate hole CH can penetrate the substrate 100. The substrate hole CH can be disposed among the pixels PA in the display area. Thus, the substrate hole CH can be formed in the display area. For example, the substrate hole CH can be formed among the light emitting elements 500. The substrate 100 can include a hole peripheral area HA including an area in which the substrate hole CH is formed. The light emitting elements 500 can be disposed outside the hole peripheral area HA. The gate lines GL and the data lines DL can bypass the substrate hole CH along an edge of the substrate hole CH in the hole peripheral area HA.

The hole peripheral area HA can include a penetrating area CA in which the substrate hole CH is formed, and a separating area SA surrounding the penetrating area CA. For example, the separating area SA can be disposed between the penetrating area CA and the pixels PA.

At least one separation structure 700 can be disposed in the separating area SA. The separation structure 700 can include an undercut structure.

Referring to FIG. 4B, the separation structure 700 can include a first separation layer 711, a second separation layer 712, and a third separation layer 713. The first separation layer 711 can be formed on the first-buffer lower layer 111 of the first buffer layer 110. For example, the first separation layer 711 can be made of the same material as the first-buffer upper layer 112 of the first buffer layer 110, and can be formed on the same layer as the first-buffer upper layer 112. The first separation layer 711 can have the same stacked structure as the first-buffer upper layer 112. A lower surface of the first separation layer 711 can contact an upper surface of the first-buffer lower layer 111. The thickness of the first separation layer 711 can be the same as the thickness of the first-buffer upper layer 112.

The second separation layer 712 can be disposed on the first separation layer 711. The second separation layer 712 can be made of the same material as the first gate insulating film 120, and can be formed on the same layer as the first gate insulating film 120. The thickness of the second separation layer 712 can be the same as the thickness of the first gate insulating film 120. The second separation layer 712 can have the same stacked structure as the first gate insulating film 120. The third separation layer 713 can be disposed on the second separation layer 712. The second separation layer 712 can be disposed between the third separation layer 713 and the first separation layer 711. The third separation layer 713 can be made of the same material as the first gate electrode 230 of the first thin film transistor 200, and can be formed on the same layer as the first gate electrode 230. The third separation layer 713 can have the same stacked structure as the first gate electrode 230. For example, each of the first and second separation layers 711 and 712 can include an insulating material layer, and the third separation layer 713 can include a metal material layer.

The third separation layer 713 can be larger width than each of the first and second separation layers 711 and 712. For example, a lower surface of the third separation layer 713 can have a greater length than an upper surface of the second separation layer 712. An end of the third separation layer 713 can protrude from a side surface of the second separation layer 712, such that both ends of the third separation layer 713 may not overlap with the second separation layer 712. Thus, the separation structure 700 can have an undercut structure. In the display apparatus according to the exemplary embodiment of the present disclosure, the second electrode 530 and the light emitting layer 520 deposited in the separating area SA can be completely separated by the separation structure 700. For example, as illustrated in FIG. 4B, the first and second intermediate layers 521 and 523 of the light emitting layer 520 and the second electrode 530 can be separated by the separation structure 700. Therefore, in the display apparatus according to the exemplary embodiment of the present disclosure, permeation of the external moisture through the light emitting layer 520 can be blocked by the separation structure 700. The second electrode 530 can be separated by the undercut structure of each separation structure 700.

The separation structure 700 can be formed using a process of forming a thin film transistor and an insulating material layer. For example, the formation of the separation structures 700 can include a step of forming the first buffer layer 110 and the first gate insulating film 120 on the separating area SA, a step of forming the third separation layer 713 made of the same metal material as the first gate electrode 230, a step of depositing the first interlayer insulating film 130, the second buffer layer 140, the second gate insulating film 150, and the second interlayer insulating film 160 on the third separation layer 713 and the first gate insulating film 120, and a step of forming the first separation layer 711 and the second separation layer 712 using an etching process. For example, the etching process can include a process of patterning the first interlayer insulating film 130, the second buffer layer 140, the second gate insulating film 150, and the second interlayer insulating film 160 which are stacked on the third separation layer 713 to expose the third separation layer 713, and a process of removing a portion of the first-buffer upper layer 112 and a portion of the first gate insulating film 120 which are exposed by the third separation layer 713. A portion of the first-buffer upper layer 112 overlapping with the third separation layer 713 can become the first separation layer 711. A portion of the first gate insulating film 120 overlapping with the third separation layer 713 can become the second separation layer 712.

The first separation layer 711 can be formed by an etching process of the first-buffer upper layer 112 on the separating area SA. The first separation layer 711 can have the same stacked structure as the first-buffer upper layer 112 on the separating area SA, and can be made of the same material as the first-buffer upper layer 112. For example, the first separation layer 711 can include a silicon oxide ($SiO_x$)-based material. The second separation layer 712 can be formed by an etching process of the first gate insulating film 120 on the separating area SA. The second separation layer 712 can have the same stacked structure as the first gate insulating film 120, and can be made of the same material as the first gate insulating film 120. Thus, in the display apparatus according to the exemplary embodiment of the present disclosure, any layer can be not added for the formation of separation structures 700, and the degradation of the process efficiency for forming the display apparatus can be minimized.

The second interlayer insulating film 160, the second gate insulating film 150, the second buffer layer 140, the first interlayer insulating film 130, the first gate insulating film 120 and the first-buffer upper layer 112 of the first buffer layer 110 can include an opening OP exposing the first-buffer lower layer 111 on the separating area SA by an etching process. The separation structure 700 can be disposed on the first-buffer lower layer 111 exposed by the opening OP. The third separation layer 713, which is the uppermost layer of the separation structure 700, can be made of a metal material, and the first and second separation layers 711 and 712 disposed between the uppermost layer of the separation structure 700, for example, the third separation layer 713, and the first-buffer lower layer 111 can be made of an insulating material.

The light emitting layer 520 and the second electrode 530 can be disposed on the third separation layer 713 of the separation structure 700 which is the uppermost layer. For example, the first and second intermediate layers 521 and 523 of the light emitting layer 520 and the second electrode 530 of the light emitting element 500 can be disposed on the third separation layer 713. The first intermediate layer 521 can contact an upper surface of the third separation layer 713.

The light emitting layer 520 and the second electrode 530 on the first-buffer lower layer 111 exposed by the opening OP can be spaced apart from the separation structure 700. As illustrated in FIG. 4B, the first and second intermediate layers 521 and 523 of the light emitting layer 520 and the second electrode 530 of the light emitting element 500, which are disposed on the first-buffer lower layer 111 exposed by the opening OP, can be disposed to be spaced apart from the first separation layer 711 of the separation structure 700. The first intermediate layer 521, the second intermediate layer 523 and the second electrode 530 can be disposed to face both side surfaces of the first separation layer 711. The first intermediate layer 521, the second intermediate layer 523 and the second electrode 530 can be disposed to be spaced apart from the both side surfaces of the first separation layer 711. The first intermediate layer 521 of the light emitting layer 520 on the first-buffer lower layer 111 exposed by the opening OP can contact the upper surface of the first-buffer lower layer 111. The first intermediate layer 521 of the light emitting layer 520 can be disposed on the second interlayer insulating film 160 in the separating area SA. The first intermediate layer 521 in the separating area SA can contact the upper surface of the second interlayer insulating film 160.

The hole peripheral area HA can include a harrier area which is disposed outside the separating area SA. The separating area SA can be disposed between the penetrating area CA and the barrier area. At least one dam can be disposed in the barrier area.

Accordingly, in the display apparatus according to the exemplary embodiment of the present disclosure, the separating area SA can be disposed between the penetrating area CA in which the substrate hole CH is formed, and the pixels PA, at least one separation structure 700 can be disposed in the separating area SA, and each separation structure 700 can include at least one undercut structure. The distance from the lower surface of the third separation layer 713 to the upper surface of the first-buffer lower layer 111 can be greater than the sum of thicknesses of the light emitting layer 520 and the second electrode 530 which are disposed in each pixel PA. For example, the sum of thicknesses of the first and second separation layers 711 and 712 can be greater than the sum of thicknesses of the first and second intermediate layers 521 and 523, and the second electrode 530. Thus, in the display apparatus according to the exemplary embodiment of the present disclosure, the light emitting layer 520 can be surely separated by the separation structure 700. For example, in the display apparatus according to the exemplary embodiment of the present disclosure, the damage of the light emitting element 500 due to the external moisture permeating through the substrate hole CH can be effectively prevented. And, the display apparatus according to the exemplary embodiment of the present disclosure can form the separation structure 700 using a process of forming the pixel circuit and the light emitting element 500 of each pixel PA. Therefore, in the display apparatus according to the exemplary embodiment of the present disclosure, the degradation of the process efficiency due to the formation process for the separation structure 700 can be prevented.

Figure 5A:
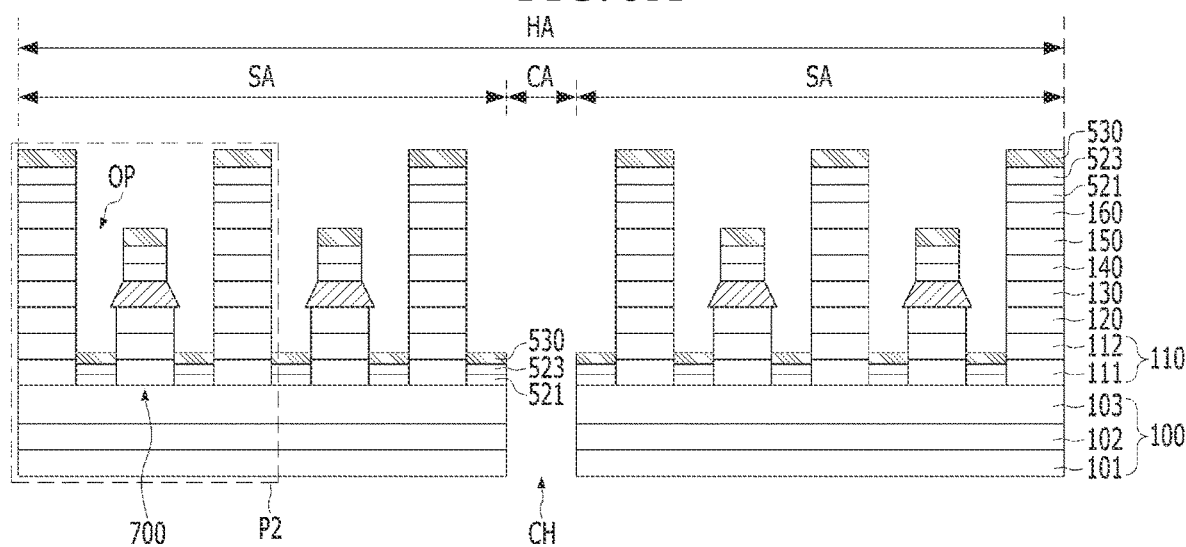
FIG. 5A is a view illustrating a cross-section of a substrate hole in a display apparatus according to another exemplary embodiment of the present disclosure.
Figure 5B:
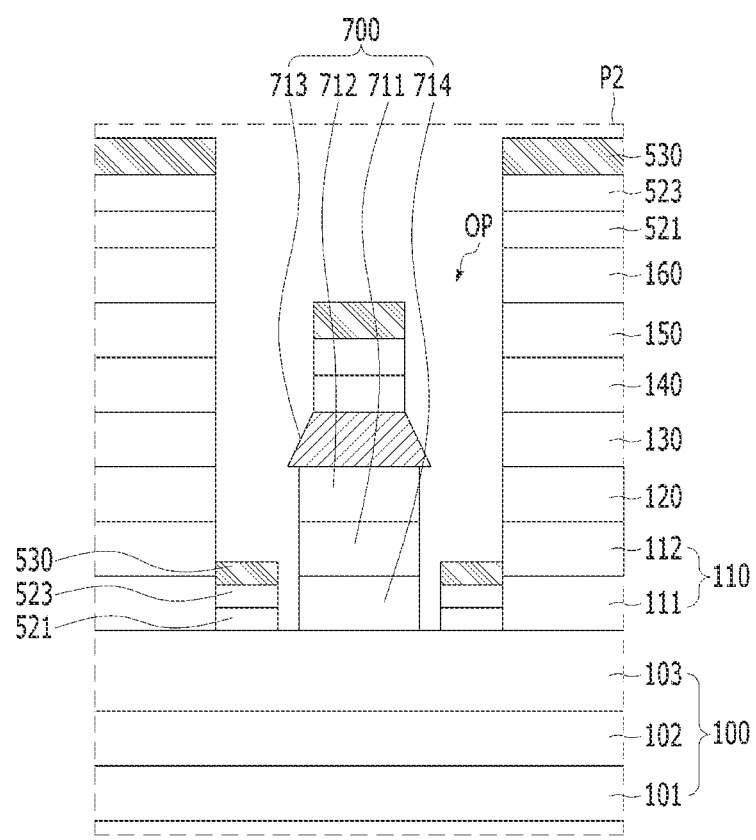
FIG. 5B is an enlarged view of an area P2 in FIG. 5A.

FIG. 5A is a view illustrating a cross-section of a substrate hole in a display apparatus according to another exemplary embodiment of the present disclosure. FIG. 5B is an enlarged view of an area P2 in FIG. 5A.

The following description will be given with reference to FIGS. 3, 4A and 4B, and an overlapping description will be omitted or briefly green. For example, a substrate 100, a first buffer layer 110, a first gate insulating film 120, a first interlayer insulating film 130, a second buffer layer 140, a second gate insulating film 150, a second interlayer insulating film 160, a passivation layer 170, a bank layer 180, a spacer 190, a light emitting element 500, an auxiliary electrode 600, a storage capacitor 400, a substrate hole CM, a first thin film transistor 200, and a second thin film transistor 300 in FIGS. 5A and 5B are identical to those of FIGS. 3, 4A and 4B. An overlapping description of the configurations of FIGS. 5A and SB substantially identical to those of FIGS. 3, 4A and 4B will be omitted or briefly given.

As illustrated in FIG. 5B, in the display apparatus according to another exemplary embodiment of the present disclosure, the separation structure 700 can further include a fourth separation layer 714. The separation structure 700 can include a first separation layer 711, a second separation layer 712, a third separation layer 713, and the fourth separation layer 714. The fourth separation layer 714 can be made of the same material as the first-buffer lower layer 111 of the first buffer layer 110, and can be disposed on the same layer as the first-buffer lower layer 111. The fourth separation layer 714 can have the same stacked structure as the first-buffer lower layer 111, and can have the same thickness as the first-buffer lower layer 111. Accordingly, the fourth separation layer 714 can be formed by a multilayer structure in which a silicon nitride ($SiN_x$)-based material and a silicon oxide ($SiO_x$)-based material are alternately formed. The fourth separation layer 714 can be disposed between the first separation layer 711 and the substrate 110. Each of the widths of the first separation layer 711, the second separation layer 712 and the fourth separation layer 714 can be smaller than the width of the third separation layer 713.

In the display apparatus according to another exemplary embodiment of the present disclosure, the second electrode 530 and the light emitting layer 520 deposited in the separating area SA can be completely separated by the separation structure 700. For example, as illustrated in FIG. 5B, the second electrode 530, the first and second intermediate layers 521 and 523 of the light emitting layer 520 can be separated by the separation structure 700. Accordingly, in the display apparatus according to another exemplary embodiment of the present disclosure, penetration of external moisture through the light emitting layer 520 can be prevented by the separation structure 700. The second electrode 550, the first and second intermediate layers 521 and 525 of the light emitting layer 520 can be separated by the undercut structure of each separation structure 700.

The second interlayer insulating film 160, the second gate insulating film 150, the second buffer layer 140, the first interlayer insulating film 130, the first gate insulating film 120 and the first buffer layer 110 disposed in the separating area SA can include an opening OP formed through an etching process to expose the substrate 100. The separation structure 700 can be disposed on the substrate 100 exposed through the opening OP. The third separation layer 713, which is the uppermost layer of the separation structure 700, can be made of a metal material, whereas the first, second and fourth separation layers 711, 712 and 714 disposed between the uppermost layer of the separation structure 700, for example, the third separation layer 713, and the substrate 100 can be made of an insulating material.

The light emitting layer 520 and the second electrode 530 can be disposed on the third separation layer 713 of the separation structure 700 which is the uppermost layer. For example, the first and second intermediate layers 521 and 523 of the light emitting layer 520 and the second electrode 530 of the light emitting element 500 can be disposed on the third separation layer 713. The first intermediate layer 521 can contact the upper surface of the third separation layer 713.

The light emitting layer 520 and the second electrode 530 can be disposed on the substrate 100 exposed through the opening OP, and can be spaced apart from the separation structure 700. As illustrated in FIG. 4B, the first and second intermediate layers 521 and 523 of the light emitting layer 520 and the second electrode 530 of the light emitting element 500, which are disposed on the substrate 100 exposed through the opening OP, can be disposal to be spaced apart from the fourth separation layer 714 of the separation structure 700. The first intermediate layer 521, the second intermediate layer 523 and the second electrode 530 can be disposed to face opposite side surfaces of the fourth separation layer 714. In addition, the first intermediate layer 521, the second intermediate layer 523 and the second electrode 530 can be disposed to be spaced apart from opposite side surfaces of the first separation layer 711. Furthermore, the first intermediate layer 521 of the light emitting layer 520 disposed on the substrate 100 exposed through the opening OP can contact the upper surface of the substrate 100. The first intermediate layer 521 of the light emitting layer 520 can be disposed on the second interlayer insulating film 160 disposed in the separating area SA. In addition, the first intermediate layer 521 disposed in the separating area SA can contact the upper surface of the second interlayer insulating film 160.

As a result, in the display apparatus according to another exemplary embodiment of the present disclosure, at least one separation structure 700 can be disposed in the separating area SA disposed between the penetrating area CA formed with the substrate hole CH and the pixels PA, and each separation structure 700 can include at least one undercut structure. In addition, the distance from the lower surface of the third separation layer 713 to the upper surface of the substrate 100 can be greater than the sum of thicknesses of the light emitting layer 520 and the second electrode 530 disposed in each pixel PA. For example, the sum of thicknesses of the first, second and fourth separation layers 711, 712 and 714 can be greater than the sum of thicknesses of the first and second intermediate layers 521 and 523, and the second electrode 530. Accordingly, in the display apparatus according to another exemplary embodiment of the present disclosure, the light emitting layer 520 can be surely separated by the separation structure 700. For example, in the display apparatus according to another exemplary embodiment of the present disclosure, it can be possible to effectively prevent damage to the light emitting element 500 caused by external moisture penetrating through the substrate hole CH. In addition, in the display apparatus according to another exemplary embodiment of the present disclosure, it can possible to form the separation structure 700 using a formation process for the pixel circuit and the light emitting element 500 of each pixel PA. Thus, in the display apparatus according to another exemplary embodiment of the present disclosure, degradation in process efficiency caused by the formation process for the separation structure 700 can be avoided.

Figure 6:
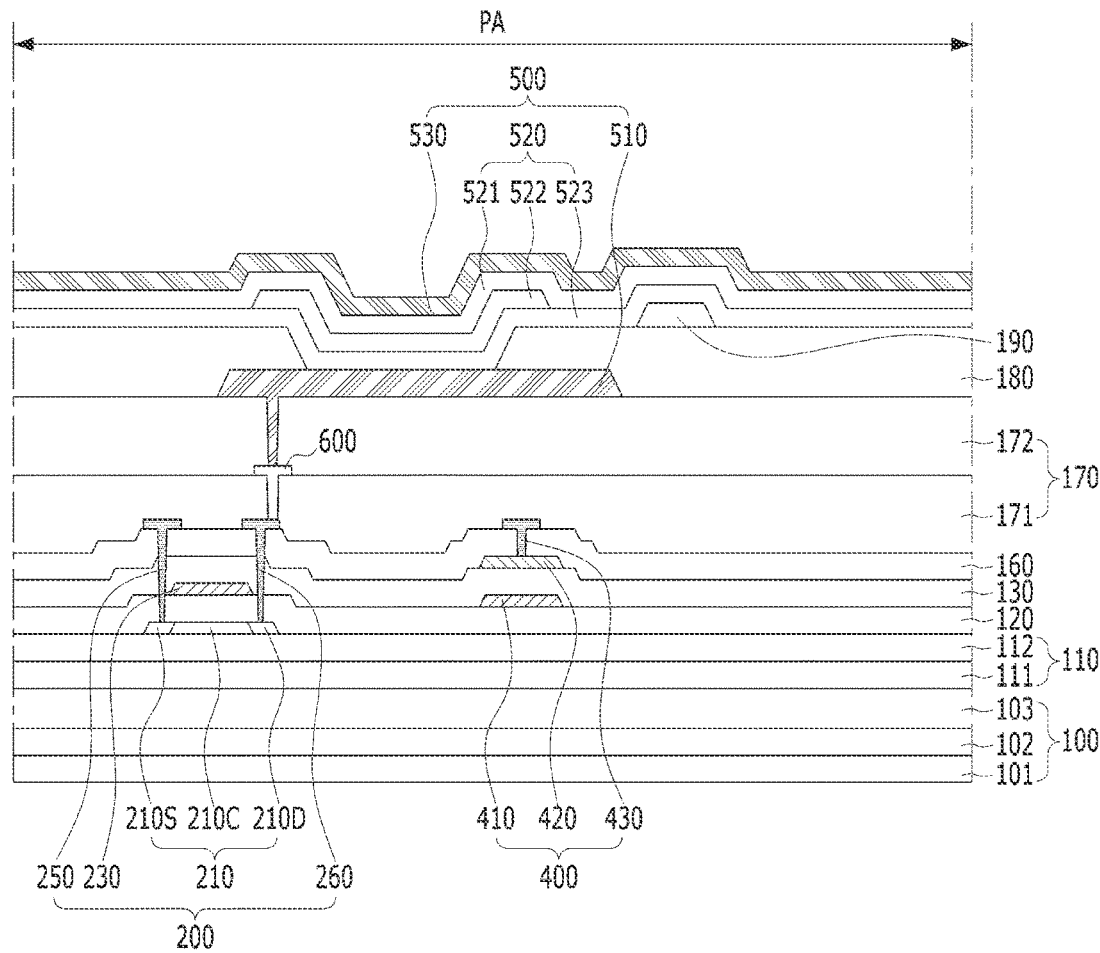
FIG. 6 is a view illustrating a cross-section of a pixel in a display apparatus according to another exemplary embodiment of the present disclosure.
Figure 7A:
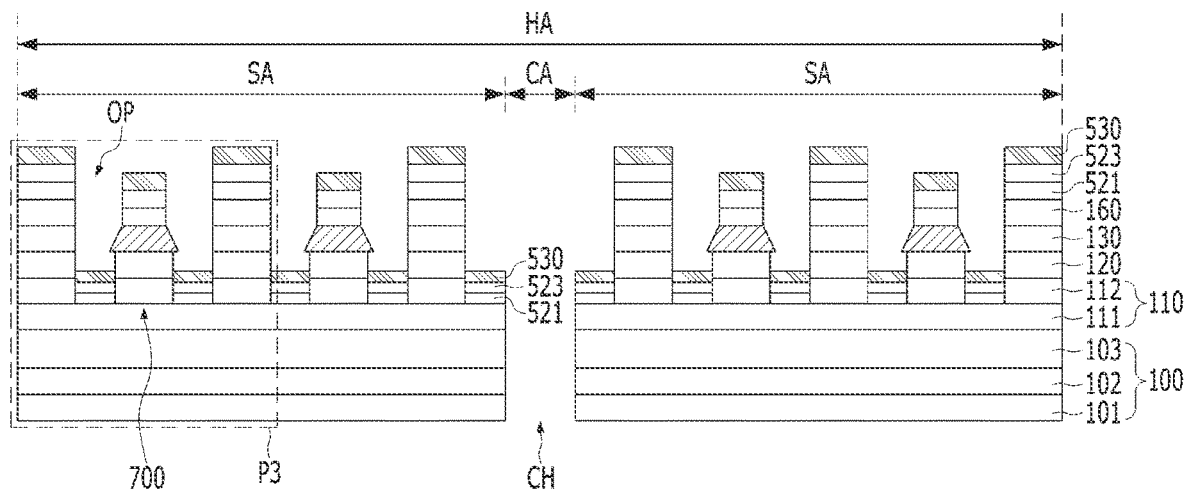
FIG. 7A is a view illustrating a cross-section of a substrate hole in the display apparatus according to another exemplary embodiment of the present disclosure.

FIG. 6 is a view illustrating a cross-section of a pixel in a display apparatus according to another exemplary embodiment of the present disclosure. FIG. 7A is a view illustrating a cross-section of a substrate hole in the display apparatus according to another exemplary embodiment of the present disclosure. FIG. 7B is an enlarged view of an area P3 in FIG. 7A.

The following description will be given with reference to FIGS. 3, 4A and 4B, and an overlapping description will be omitted or briefly given. For example, a substrate 100, a first buffer layer 110, a first gate insulating film 120, a first interlayer insulating film 130, a second interlayer insulating film 160, a passivation layer 170, a bank layer 180, a spacer 190, a light emitting element 500, an auxiliary electrode 600, a substrate hole CH, and a separation structure 700 in FIGS. 6, 7A and 7B are identical to those of FIGS. 3, 4A and 4B. An overlapping description of configurations of FIGS. 6, 7A and 7B substantially identical to those of FIGS. 3, 4A and 4B will be omitted or briefly given.

Referring to FIG. 6, the display apparatus according to another exemplary embodiment of the present disclosure can include the substrate 100, the first buffer layer 110, the first gate insulating film 120, the first interlayer insulating film 130, the second interlayer insulating film 160, the passivation layer 170, the bank layer 180, the spacer 190, the light emitting element 500, the auxiliary electrode 600, a storage capacitor 400, a first thin film transistor 200, the substrate hole CH, and the separation structure 700.

The substrate 100 can include pixels PA defined by gate lines GL and data lines DL. The light emitting element 500 can be disposed at each pixel PA. In each pixel PA, a pixel circuit, which is electrically connected to the corresponding light emitting element 500, can be disposed. The pixel circuit of each pixel PA can control operation of the corresponding light emitting element 500 in accordance with a gate signal and a data signal. For example, the pixel circuit can include the first thin film transistor 200 and the storage capacitor 400.

Meanwhile, the first thin film transistor 200 can include a first semiconductor pattern 210, a first gate electrode 230, a first source electrode 250, and a first drain electrode 260. In addition, the storage capacitor 400 can include a first storage electrode 410, a second storage electrode 420, and a third storage electrode 430. The first semiconductor pattern 210 can be disposed on the first buffer layer 110. The first semiconductor pattern 210 can include a semiconductor material. For example, the first semiconductor pattern 210 can include polysilicon (poly-Si) which is a polycrystalline semiconductor material. For example, the first semiconductor pattern 210 can include low-temperature polysilicon (LTPS).

The first gate insulating film 120 can be disposed on the first semiconductor pattern 210. The first gate electrode 230 of the first thin film transistor 200 and the first storage electrode 410 of the storage capacitor 400 can be disposed on the first gate insulating film 120. The first storage electrode 410 and the first gate electrode 230 can be made of the same material, and can be disposed on the same layer.

The first interlayer insulating film 130 can be disposed on the first storage electrode 410, the first gate insulating film 120, and the first gate electrode 230. The second storage electrode 420 can be formed on the first interlayer insulating film 130.

The second interlayer insulating film 160 can be formed on the first interlayer insulating film 130 and the second storage electrode 420.

Contact holes can be formed to expose the first semiconductor pattern 210 of the first thin film transistor 200 by etching the second interlayer insulating film 160, the first interlayer insulating film 130, and the first gate insulating film 120. Accordingly, contact holes can be formed to expose the first source region 210S and the first drain region 210D in the first semiconductor pattern 210, respectively.

In addition, a contact hole can be formed to expose the second storage electrode 420 of the storage capacitor 400 by etching the second interlayer insulating film 160. Accordingly, a contact hole can be formed to expose the second storage electrode 420 of the storage capacitor 400.

On the second interlayer insulating film 160, the first source electrode 250 and the first drain electrode 260 in the first thin film transistor 200 and the third storage electrode 430 of the storage capacitor 400 can be disposed.

The first source electrode 250 and the first drain electrode 260 in the first thin film transistor 200 can be connected to the first source region 210S and the first drain region 210D) in the first semiconductor pattern 210 via the contact holes formed through the second interlayer insulating film 160, the first interlayer insulating film 130 and the first gate insulating film 120, respectively.

The third storage electrode 430 of the storage capacitor 400 can be connected to the second storage electrode 420 via the contact hole formed through the second inter layer insulating film 160.

The first source electrode 250, the first drain electrode 260 and the third storage electrode 430 can be made of the same material, and can be disposed on the same layer.

A first passivation layer 171 of the passivation layer 170 can be formed on the second interlayer insulating film 160, the first source electrode 250, the first drain electrode 260, and the third storage electrode 430. A contact hole can be formed through the first passivation layer 171 in order to expose the first drain electrode 260 of the first thin film transistor 200.

An auxiliary electrode 600 can be formed on the first passivation layer 171. The auxiliary electrode 600 can be connected to the first drain electrode 260 of the first thin film transistor 200 exposed through the contact hole of the first passivation layer 171. A second passivation layer 172 can be formed on the first passivation layer 171 and the auxiliary electrode 600. A contact hole can be formed through the second passivation layer 172 in order to expose the auxiliary electrode 600. The second passivation layer 172 can eliminate a step formed due to the pixel circuit of each pixel PA. For example, the upper surface of the second passivation layer 172 directed to the light emitting element 500 of each pixel PA can be a flat surface.

The light emitting element 500 of each pixel PA can be electrically connected to the first thin film transistor of the pixel PA.

Referring to FIG. 7A, the substrate hole CH can be formed in the display area of the substrate 100. The substrate hole CH can extend through the substrate 100. The substrate hole CH can be disposed between pixels PA. Accordingly, the substrate hole CH can be formed in the display area. For example, the substrate hole CH can be formed between the light emitting elements 500 of the pixels PA. The substrate 100 can include a hole peripheral area HA including an area in which the substrate hole CH is formed. The light emitting elements 500 can be disposed outside the hole peripheral area HA. The gate lines GL and the data lines DL in the hole peripheral area HA can bypass the substrate hole CH along an edge of the substrate hole CH.

The hole peripheral area HA can include a penetrating area CA in which the substrate hole CH is formed, and a separating area SA surrounding the penetrating area CA. For example, the separating area SA can be disposed between the penetrating area CA and the pixels PA.

At least one separation structure 700 can be disposed in the separating area SA. The separation structure 700 can include an undercut structure.

Referring to FIG. 7B, the separation structure 700 can include a first separation layer 711, a second separation layer 712, and a third separation layer 713. The first separation layer 711 can be formed on the first-buffer lower layer 111 of the first buffer layer 110. In addition, the first separation layer 711 can be made of the same material as the first-buffer upper layer 112 of the first buffer layer 110, and can be formed on the same layer as the first-buffer upper layer 112. Furthermore, the first separation layer 711 can have the same stacked structure as the first-buffer upper layer 112. The lower surface of the first separation layer 711 can contact the upper surface of the first-buffer lower layer 111. The thickness of the first separation layer 711 can be equal to the thickness of the first-buffer upper layer 112.

In addition, the second separation layer 712 can be disposed on the first separation layer 711. The second separation layer 712 can be made of the same material as the first gate insulating film 120, and can be formed on the same layer as the first gate insulating film 120. Furthermore, the thickness of the second separation layer 712 can be equal to the thickness of the first gate insulating film 120. In addition, the second separation layer 712 can have the same stacked structure as the first gate insulating film 120. Meanwhile, the third separation layer 713 can be disposed on the second separation layer 712. The second separation layer 712 can be disposed between the third separation layer 713 and the first separation layer 711. In addition, the third separation layer 713 can be made of the same material as the first gate electrode 230 of the first thin film transistor 200, and can be formed on the same layer as the first gate electrode 230. Furthermore, the third separation layer 713 can have the same stacked structure as the first gate electrode 230. As such, each of the first and second separation layers 711 and 712 can be constituted by an insulating material layer, whereas the third separation layer 713 can be constituted by a metal material layer.

The width of the third separation layer 713 can be greater than ach of those of the first and second separation layers 711 and 712. For example, the lower surface of the third separation layer 713 can have a greater length than the upper surface of the second separation layer 712. Opposite ends of the third separation layer 713 may not overlap with the second separation layer 712, and can protrude from opposite side surfaces of the second separation layer 712, respectively. As such, the separation structure 700 can have an undercut structure. In the display apparatus according to another exemplary embodiment of the present disclosure, the second electrode 530 and the light emitting layer 520 deposited in the separating area SA can be completely separated by the separation structure 700. For example, as illustrated in FIG. 7B, the second electrode 530 and the first and second intermediate layers 521 and 523 of the light emitting layer 520 can be separated by the separation structure 700. Accordingly, in the display apparatus according to the exemplary embodiment of the present disclosure, penetration of external moisture through the light emitting layer 520 can be presented by the separation structure 700. The second electrode 530 can be separated by the undercut structure of each separation structure 700.

The separation structure 700 can be formed using a process for forming a thin film transistor and an insulating material layer. For example, for formation of separation structures 700, the first buffer layer 110 and the first gate insulating film 120 can be formed in the separating area SA. In addition, the third separation layer 713, which is made of the same metal material as the first gate electrode 230, can be formed. Subsequently, the first inter layer insulating film 130, and the second interlayer insulating film 160 are deposited on the third separation layer 713 and the first gate insulating film 120. Thereafter, the first separation layer 711 and the second separation layer 712 can be formed using an etching process. For example, through an etching process, the first interlayer insulating film 130 and the second interlayer insulating film 160 deposited on the third separation layer 713 can be patterned to expose the third separation layer 713. Thereafter, the first-buffer upper layer 112 and the first gate insulating film 120 disposed in an area defined beneath the third separation layer 713 while overlapping with the third separation layer 713 can be patterned and, as such, can be formed into the first separation layer 711 and the second separation layer 712. The first-buffer upper layer 112 can be patterned and, as such, can be formed into the first separation layer 711, whereas the first gate insulating film 120 can be patterned and, as such, can be formed into the second separation layer 712.

The first separation layer 711 can be formed through an etching process for the first-buffer upper layer 112 formed in the separating area SA. The first separation layer 711 can have the same stacked structure as the first-buffer upper layer 112 formed in the separating area SA, and can be made of the same material as the first-buffer upper layer 112. For example, the first separation layer 711 can include a silicon oxide ($SiO_x$)-based material. The second separation layer 712 can be formed through an etching process for the first gate insulating film 120 formed in the separating area SA. As such, the second separation layer 712 can have the same stacked structure as the first gate insulating film 120, and can be made of the same material as the first gate insulating film 120. Accordingly, in the display apparatus according to another exemplary embodiment of the present disclosure, no separate layer is added for formation of separation structures 700 and, as such, degradation in the process efficiency for formation of the display apparatus can be minimized.

The second interlayer insulating film 160, the first interlayer insulating film 130, the first gate insulating film 120 and the first-buffer upper layer 112 of the first buffer layer 110 disposed in the separating area SA can include an opening OP formed through an etching process to expose the first-buffer lower layer 111. The separation structure 700 can be disposed on the first-buffer lower layer 111 exposed through the opening OP. The third separation layer 713, which is the uppermost layer of the separation structure 700, can be made of a metal material, whereas the first and second separation layers 711 and 712 disposed between the uppermost layer of the separation structure 700, for example, the third separation layer 713, and the first-buffer lower layer 111 can be made of an insulating material.

The light emitting layer 520 and the second electrode 530 can be disposed on the third separation layer 713 of the separation structure 700 which is the uppermost layer. For example, the first and second intermediate layers 521 and 523 of the light emitting layer 520 and the second electrode 530 of the light emitting element 500 can be disposed on the third separation layer 713. The first intermediate layer 521 can contact the upper surface of the third separation layer 713.

The light emitting layer 520 and the second electrode 530 can be disposed on the first-buffer lower layer 111 exposed through the opening OP, and can be spaced apart from the separation structure 700. As illustrated in FIG. 7B, the first and second intermediate layers 521 and 523 of the light emitting layer 520 and the second electrode 530 of the light emitting element 500, which are disposed on the first-buffer lower layer 111 exposed through the opening OP, can be disposed to be spaced apart from the first separation layer 711 of the separation structure 700. The first intermediate layer 521, the second intermediate layer 523 and the second electrode 530 can be disposed to face opposite side surfaces of the first separation layer 711. In addition, the first intermediate layer 521, the second intermediate layer 523 and the second electrode 530 can be disposed to be spaced apart from the opposite side surfaces of the first separation layer 711. Furthermore, the first intermediate layer 521 of the light emitting layer 520 disposed on the first-buffer lower layer 111 exposed through the opening OP can contact the upper surface of the first-buffer lower layer 111. The first intermediate layer 521 of the light emitting layer 520 can be disposed on the second interlayer insulating film 160 disposed in the separating area SA. In addition, the first intermediate layer 521 disposed in the separating area SA can contact the upper surface of the second interlayer insulating film 160.

The hole peripheral area HA can further include a barrier area disposed outside the separating area SA. The separating area SA can be disposed between the penetrating area CA and the barrier area BA. At least one dam can be disposed in the harrier area BA.

As a result, in the display apparatus according to another exemplary embodiment of the present disclosure, at least one separation structure 700 can be disposed in the separating area SA disposed between the penetrating area CA formed with the substrate hole CH and the pixels PA, and each separation structure 700 can include at least one undercut structure. In addition, the distance from the lower surface of the third separation layer 713 to the upper surface of the first-buffer lower layer 111 can be greater than the sum of thicknesses of the light emitting layer 520 and the second electrode 530 disposed in each pixel PA. For example, the sum of thicknesses of the first and second separation layers 711 and 712 can be greater than the sum of thicknesses of the first and second intermediate layers 521 and 523, and the second electrode 530. Accordingly, in the display apparatus according to another exemplary embodiment of the present disclosure, the light emitting layer 520 can be surely separated by the separation structure 700. For example, in the display apparatus according to another exemplary embodiment of the present disclosure, it can be possible to effectively prevent damage to the light emitting element 500 caused by external moisture penetrating through the substrate hole CH. In addition, in the display apparatus according to another exemplars embodiment of the present disclosure, it can possible to form the separation structure 700 using a formation process for the pixel circuit and the light emitting element 500 of each pixel PA. Thus, in the display apparatus according to another exemplary embodiment of the present disclosure, degradation in process efficiency caused by the formation process for the separation structure 700 can be avoided.

FIG. 8 is a view illustrating a cross-section of a separation structure in a display apparatus according to another exemplary embodiment of the present disclosure. The following description will be given with reference to FIGS. 6 and 7B, and an overlapping description will be omitted or briefly given. For example, a substrate 100, a first buffer layer 110, a first gate insulating film 120, a first interlayer insulating film 130, a second interlayer insulating film 160, a passivation layer 170, a bank layer 180, a spacer 190, a light emitting element 500, an auxiliary electrode 600, a storage capacitor 400, a substrate hole CH, and a first thin film transistor 200 in FIG. 8 are identical to those of FIGS. 6 and 7B. An overlapping description of configurations of FIG. 8 substantially identical to those of FIGS. 6 and 7B will be omitted or briefly given.

As illustrated in FIG. 8, in the display apparatus according to another exemplary embodiment of the present disclosure, the separation structure 700 can further include a fourth separation layer 714. The separation structure 700 can include a first separation layer 711, a second separation layer 712, a third separation layer 713, and the fourth separation layer 714. The fourth separation layer 714 can be made of the same material as the first-buffer lower layer 111 of the first buffer layer 110, and can be disposed on the same layer as the first-buffer lower layer 111. The fourth separation layer 714 can have the same stacked structure as the first-buffer lower layer 111, and can have the same thickness as the first-buffer lower layer 111. Accordingly, the fourth separation layer 714 can be formed by a multilayer structure in which a silicon oxide (SiO$_x$)-based material and a silicon nitride (SiN$_x$)-based material are alternately formed. The fourth separation layer 714 can be disposed between the first separation layer 711 and the substrate 110. Each of the widths of the first separation layer 711, the second separation layer 712 and the fourth separation layer 714 can be smaller than the width of the third separation layer 713.

In the display apparatus according to another exemplary embodiment of the present disclosure, the second electrode 530 and the light emitting layer 520 deposited in the separating area SA can be completely separated by the separation structure 700. For example, as illustrated in FIG. 8, the second electrode 530, the first and second intermediate layers 521 and 525 of the light emitting layer 520 can be separated by the separation structure 700. Accordingly, in the display apparatus according to another exemplary embodiment of the present disclosure, penetration of external moisture through the light emitting layer 520 can be presented by the separation structure 700. The second electrode 530, the first and second intermediate layers 521 and 523 of the light emitting layer 520 can be separated by the undercut structure of each separation structure 700.

The second interlayer insulating film 160, the first interlayer insulating film 130, the first gate insulating film 120 and the first buffer layer 110 disposed in the separating area SA can include an opening OP formed through an etching process to expose the substrate 100. The separation structure 700 can be disposed on the substrate 100 exposed through the opening OP. The third separation layer 713, which is the uppermost layer of the separation structure 700, can be made of a metal material, whereas the first, second and fourth separation layers 711, 712 and 714 disposed between the uppermost layer of the separation structure 700, for example, the third separation layer 713, and the substrate 100 can be made of an insulating material.

The light emitting layer 520 and the second electrode 530 can be disposed on the third separation layer 713 of the separation structure 700 which is the uppermost layer. For example, the first and second intermediate layers 521 and 523 of the light emitting layer 520 and the second electrode 530 of the light emitting element 500 can be disposed on the third separation layer 713. The first intermediate layer 521 can contact the upper surface of the third separation layer 713.

The light emitting layer 520 and the second electrode 530 can be disposed on the substrate 100 exposed through the opening OP, and can be spaced apart from the separation structure 700. As illustrated in FIG. 8, the first and second intermediate layers 521 and 525 of the light emitting layer 520 and the second electrode 530 of the light emitting element 500, which are disposed on the substrate 100 exposed through the opening OP, can be disposed to be spaced apart from the fourth separation layer 714 of the separation structure 700. The first intermediate layer 521, the second intermediate layer 523 and the second electrode 530 can be disposed to face opposite side surfaces of the fourth separation layer 714. In addition, the first intermediate layer 521, the second intermediate layer 523 and the second electrode 530 can be disposed to be spaced apart from opposite side surfaces of the first separation layer 711. Furthermore, the first intermediate layer 521 of the light emitting layer 520 disposed on the substrate 100 exposed through the opening OP can contact the upper surface of the substrate 100. The first intermediate layer 521 of the light emitting layer 520 can be disposed on the second inter layer insulating film 160 disposed in the separating area SA. In addition, the first intermediate layer 521 disposed in the separating area SA can contact the upper surface of the second interlayer insulating film 160.

As a result in the display apparatus according to another exemplary embodiment of the present disclosure, at least one separation structure 700 can be disposed in the separating area SA disposed between the penetrating area CA formed with the substrate hole CH and the pixels PA, and each separation structure 700 can include at least one undercut structure. In addition, the distance from the lower surface of the third separation layer 713 to the upper surface of the substrate 100 can be greater than the sum of thicknesses of the light emitting layer 520 and the second electrode 530 disposed in each pixel PA. For example, the sum of thicknesses of the first and second separation layers 711 and 712, and the fourth separation layer 714 can be greater titan the sum of thicknesses of the first and second intermediate layers 521 and 523, and the second electrode 530. Accordingly, in the display apparatus according to another exemplary embodiment of the present disclosure, the light emitting layer 520 can be surely separated by the separation structure 700. For example, in the display apparatus according to another exemplary embodiment of the present disclosure, it can be possible to effectively prevent damage to the light emitting element 500 caused by external moisture penetrating through the substrate hole CH. In addition, in the display apparatus according to another exemplary embodiment of the present disclosure, it can possible to form the separation structure 700 using a formation process for the pixel circuit and the light emitting element 50 of each pixel PA. Thus, in the display apparatus according to another exemplary embodiment of the present disclosure, degradation in process efficiency caused by the formation process for the separation structure 700 can be avoided.

A display apparatus according to one exemplary embodiment of the present disclosure can include a substrate including a penetrating area including a substrate hole, and a separating area surrounding the penetrating area, a first buffer layer including a first-buffer lower layer disposed on the substrate, and a first-buffer upper layer disposed on the first-buffer lower layer, a first thin film transistor including a first semiconductor pattern disposed on the first-buffer upper layer while including polysilicon, a first gate electrode overlapping with the first semiconductor pattern under a condition that a first gate insulating film is interposed between the first gate electrode and the first semiconductor pattern, and a first source electrode and a first drain electrode, which are connected to the first semiconductor pattern, a second thin film transistor including a second semiconductor pattern including an oxide semiconductor, a second gate electrode overlapping with the second semiconductor pattern under a condition that a second gate insulating film is interposed between the second gate electrode and the second semiconductor pattern, and a second source electrode and a second drain electrode, which are connected to the second semiconductor pattern, and a separation structure disposed in the separating area of the substrate, the separation structure including a first separation layer having the same stacked structure as the first-buffer upper layer, a second separation layer having the same stacked structure as the first gate insulating film, and a third separation layer having the same stacked structure as the first gate electrode.

In accordance with an embodiment of the present disclosure, the third separation layer can include the same metal material as the first gate electrode, the first separation layer can include the same insulating material as the first-buffer upper layer, and the second separation layer can include the same insulating material as the first gate insulating film.

In accordance with an embodiment of the present disclosure, the second separation layer can be disposed between the third separation layer and the first separation layer.

In accordance with an embodiment of the present disclosure, the display apparatus can further include a light emitting element connected to the first thin film transistor. In this case, the light emitting element can include a first electrode, a light emitting layer disposed on the first electrode, and a second electrode disposed on the light emitting layer.

In accordance with an embodiment of the present disclosure, the light emitting layer can include a first intermediate layer, a light emitting material layer disposed on the first intermediate layer, and a second intermediate layer disposed on the light emitting material layer.

In accordance with an embodiment of the present disclosure, the first intermediate layer, the second intermediate layer, and the second electrode can be disposed on the third separation layer of the separation structure, and the first intermediate layer can contact an upper surface of the third separation layer.

In accordance with an embodiment of the present disclosure, the third separation layer can have a greater width than each of the first separation layer and the second separation layer.

In accordance with an embodiment of the present disclosure, the third separation layer can be an uppermost layer of the separation structure.

In accordance with an embodiment of the present disclosure, the separation structure can further include a fourth separation layer disposed between the first separation layer and the substrate. The fourth separation layer can include the same stacked structure and the same insulating material as the first-buffer lower layer.

A display apparatus according to another exemplary embodiment of the present disclosure can include a substrate including a penetrating area including a substrate hole, and a separating area surrounding the penetrating area, a first buffer layer including a first-buffer lower layer disposed on the substrate, and a first-buffer tipper layer disposed on the first-buffer lower layer, a first thin film transistor including a first semiconductor pattern disposed on the first-buffer upper layer, a first gate electrode overlapping with the first semiconductor pattern under a condition that a first gate insulating film is interposed between the first gate electrode and the first semiconductor pattern, and a first source electrode and a first drain electrode, which are connected to the first semiconductor pattern, a first interlayer insulating film, disposed on the first gate electrode, a second interlayer insulating film disposed on the first interlayer insulating film, an opening extending through the second interlayer insulating film the first interlayer insulating film, the first gate insulating film and the first-buffer upper layer, to expose the first-buffer lower layer disposed in the separating area, and a separation structure disposed in the opening, the separation structure including a first separation layer contacting the first-buffer lower layer while having the same stacked structure as the first-buffer upper layer, a second separation layer having the same stacked structure as the first gate insulating film and a third separation layer having the same stacked structure as the first gate electrode.

In accordance with an embodiment of the present disclosure, the third separation layer can have a greater width than each of the first separation layer and the second separation layer.

In accordance with an embodiment of the present disclosure, the third separation layer is an uppermost layer of the separation structure.

In accordance with an embodiment of the present disclosure, the display apparatus can further include a light emitting element connected to the first thin film transistor. In this case, the light emitting element can include a first electrode, a light emitting layer disposed on the first electrode, and a second electrode disposed on the light emitting layer.

In accordance with an embodiment of the present disclosure, the light emitting layer can include a first intermediate layer, a light emitting material layer disposed on the first intermediate layer, and a second intermediate layer disposed on the light emitting material layer.

In accordance with an embodiment of the present disclosure, the first intermediate layer, the second intermediate layer, and the second electrode can be disposed on the third separation layer of the separation structure, and the first intermediate layer can contact an upper surface of the third separation layer.

A display apparatus according to another exemplary embodiment of the present disclosure can include a substrate including a penetrating area including a substrate hole, and a separating area surrounding the penetrating area, a first buffer layer disposed on the substrate, a first thin film transistor including a first semiconductor pattern disposed on the first buffer layer, a first gate electrode overlapping with the first semiconductor pattern under a condition that a first gate insulating film is interposed between the first gate electrode and the first semiconductor pattern, and a first source electrode and a first drain electrode, which are connected to the first semiconductor pattern, a first interlayer insulating film disposed on the first gate electrode, a second interlayer insulating film disposed on the first interlayer insulating film, an opening extending through the second interlayer insulating film, the first interlayer insulating film, the first gate insulating film and the first buffer layer, to expose the substrate disposed in the separating area, and a separation structure disposed in the opening, the separation structure including a first separation layer contacting the substrate, a second separation layer disposed on the first separation layer, and a third separation layer disposed on the second separation layer.

In accordance with an embodiment of the present disclosure, the first separation layer can include the same material as the first buffer layer while having the same stacked structure as the first buffer layer. The second separation layer can include the same material as the first gate insulating film while having the same stacked structure as the first gate insulating film. The third separation layer can include the same material as the first gate electrode while having the same stacked structure as the first gate electrode.

In accordance with an embodiment of the present disclosure, the third separation layer can have a greater width than each of the first separation layer and the second separation layer.

In accordance with an embodiment of the present disclosure, the third separation layer can be an uppermost layer of the separation structure.

In accordance with an embodiment of the present disclosure, the display apparatus can further include a light emitting element connected to the first thin film transistor. In this case, the light emitting element can include a first electrode, a light emitting layer disposed on the first electrode, and a second electrode disposed on the light emitting layer.

In accordance with an embodiment of the present disclosure, the light emitting layer can include a first intermediate layer, a light emitting material layer disposed on the first intermediate layer, and a second intermediate layer disposed on the light emitting material layer.

In accordance with an embodiment of the present disclosure, the first intermediate layer, the second intermediate layer, and the second electrode can be disposed on the third separation layer of the separation structure, and the first intermediate layer can contact an upper surface of the third separation layer.

In the display apparatus according to each exemplary embodiment of the present disclosure, at least one separation structure can be disposed between the substrate hole and the light emitting elements. Each light emitting element can include a light e titling layer disposed between the first electrode and the second electrode. Each separation structure can include at least one undercut structure. Each undercut structure can have a greater depth and a greater length than the thickness of the light emitting layer. Accordingly, in the display apparatus according to each exemplary embodiment of the present disclosure, a migration path of external moisture penetrating through the substrate hole can be blocked by the separation structure. Thus, in the display apparatus according to each exemplary embodiment of the present disclosure, lifespan and reliability of the light emitting elements can be enhanced.

Those skilled in the art to which the present disclosure pertains can appreciate that various modifications and applications in the foregoing description can be possible without changing essential characteristics of the embodiments. Therefore, the above-described embodiments should be understood as exemplary rather than limiting in all aspects. In addition, the scope of the present disclosure should also be defined by the claims below rather than the above detailed description. All modifications or alterations as would be derived from the equivalent concept intended to be included within the scope of the present disclosure should also be interpreted as falling within the scope of the present disclosure.

What is claimed is:

1. A display apparatus comprising:
    a substrate including a penetrating area and a separating area surrounding the penetrating area, the penetrating area including a substrate hole;
    a first buffer layer including a first-buffer lower layer on the substrate, and a first-buffer upper layer on the first-buffer lower layer;
    a first thin film transistor on the first-buffer upper layer, the first thin film transistor including a first semiconductor pattern, a first gate electrode, a first source electrode and a first drain electrode, the first semiconductor pattern including poly-silicon, the first gate electrode overlapping with the first semiconductor pattern under a condition that a first gate insulating film is interposed between the first gate electrode and the first semiconductor pattern, the first source electrode and the first drain electrode connected to the first semiconductor pattern;
    a second thin film transistor including a second semiconductor pattern, a second gate electrode, a second source electrode and a second drain electrode, the second semiconductor pattern including an oxide semiconductor, the second gate electrode overlapping with the second semiconductor pattern under a condition that a second gate insulating film is interposed between the second gate electrode and the second semiconductor pattern, the second source electrode and the second drain electrode connected to the second semiconductor pattern; and
    a separation structure in the separating area of the substrate, the separation structure including a first separation layer having a same stacked structure as the first-buffer upper layer, a second separation layer having a same stacked structure as the first gate insulating film, and a third separation layer having a same stacked structure as the first gate electrode,
    wherein the third separation layer which is an uppermost layer of the separation structure, has a greater width than each of the first separation layer and the second separation layer.

2. The display apparatus according to claim 1, wherein the third separation layer comprises a same metal material as the first gate electrode, the first separation layer comprises a same insulating material as the first-buffer upper layer, and the second separation layer comprises a same insulating material as the first gate insulating film.

3. The display apparatus according to claim 2, wherein the second separation layer is disposed between the third separation layer and the first separation layer.

4. The display apparatus according to claim 3, further comprising a light emitting element connected to the first thin film transistor,
    wherein the light emitting element comprises a first electrode, a light emitting layer disposed on the first electrode, and a second electrode disposed on the light emitting layer.

5. The display apparatus according to claim 4, wherein the light emitting layer comprises a first intermediate layer, a light emitting material layer disposed on the first intermediate layer, and a second intermediate layer disposed on the light emitting material layer.

6. The display apparatus according to claim 5, wherein the first intermediate layer, the second intermediate layer, and the second electrode are disposed on the third separation layer of the separation structure, and
   wherein the first intermediate layer contacts an upper surface of the third separation layer.

7. The display apparatus according to claim 1, wherein both ends of the third separation layer protrude from side surfaces of the second separation layer.

8. The display apparatus according to claim 2, wherein:
   the separation structure further comprises a fourth separation layer disposed between the first separation layer and the substrate; and
   the fourth separation layer comprises a same stacked structure and a same insulating material as the first-buffer lower layer.

9. The display apparatus according to claim 4, wherein a distance from a lower surface of the third separation layer to an upper surface of the first-buffer lower layer is greater than a sum of thicknesses of the light emitting layer and the second electrode.

10. The display apparatus according to claim 5, wherein the separation structure further comprises a fourth separation layer disposed between the first separation layer and the substrate, and
    a sum of thicknesses of the first, second and fourth separation layers is greater than a sum of thicknesses of the first and second intermediate layers, and the second electrode.

11. The display apparatus according to claim 5, wherein the first and second intermediate layers and the second electrode are separated by the separation structure.

12. The display apparatus according to claim 1, wherein the separation structure includes at least one undercut structure.

13. The display apparatus according to claim 8, wherein each of widths of the first separation layer, the second separation layer and the fourth separation layer is smaller than the width of the third separation layer.

* * * * *